United States Patent
Tobita

(10) Patent No.: US 7,636,412 B2
(45) Date of Patent: Dec. 22, 2009

(54) SHIFT REGISTER CIRCUIT AND IMAGE DISPLAY APPARATUS EQUIPPED WITH THE SAME

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 96 days.

(21) Appl. No.: 11/734,407

(22) Filed: Apr. 12, 2007

(65) Prior Publication Data

US 2007/0248204 A1 Oct. 25, 2007

(30) Foreign Application Priority Data

Apr. 25, 2006 (JP) .............................. 2006-120119

(51) Int. Cl.
*G11C 19/00* (2006.01)
(52) U.S. Cl. .............................. 377/64; 377/68; 377/69; 377/74
(58) Field of Classification Search ........................ None
See application file for complete search history.

(56) References Cited

U.S. PATENT DOCUMENTS

| | | | | | |
|---|---|---|---|---|---|
| 4,623,908 | A | * | 11/1986 | Oshima et al. ................. | 257/66 |
| 5,517,542 | A | * | 5/1996 | Huq ............................. | 377/78 |
| 5,859,630 | A | * | 1/1999 | Huq ............................. | 345/100 |
| 6,426,743 | B1 | * | 7/2002 | Yeo et al. ..................... | 345/213 |
| 6,690,347 | B2 | | 2/2004 | Jeon et al. | |
| 6,778,627 | B2 | * | 8/2004 | Yu ................................ | 377/72 |
| 7,106,292 | B2 | | 9/2006 | Moon | |
| 7,215,315 | B2 | * | 5/2007 | Morosawa et al. ........... | 345/100 |
| 7,233,308 | B2 | * | 6/2007 | Park ............................. | 345/100 |
| 7,250,788 | B2 | * | 7/2007 | Lee et al. ..................... | 326/46 |
| 7,327,343 | B2 | * | 2/2008 | Lu et al. ...................... | 345/100 |
| 7,369,111 | B2 | * | 5/2008 | Jeon et al. .................... | 345/100 |

FOREIGN PATENT DOCUMENTS

| JP | 2001-506044 | 5/2001 |
|---|---|---|
| JP | 2001-350438 | 12/2001 |
| JP | 2002-258819 | 9/2002 |
| JP | 2004-157508 | 6/2004 |

OTHER PUBLICATIONS

U.S. Appl. No. 11/741,232, filed Apr. 27, 2007, Tobita.
U.S. Appl. No. 11/937,791, filed Nov. 9, 2007, Tobita.
U.S. Appl. No. 11/856,264, filed Sep. 17, 2007, Tobita.

* cited by examiner

*Primary Examiner*—Tuan Lam
(74) *Attorney, Agent, or Firm*—Oblon, Spivak, McClelland, Maier & Neustadt, L.L.P.

(57) ABSTRACT

Malfunction caused by leakage current of the transistor is prevented in the shift register in which the signal can be shifted bi-directionally. The bi-directional unit shift register includes a transistor Q1 between a clock terminal CK and an output terminal OUT, a transistor Q2 for discharging the output terminal OUT, and transistors Q3, Q4 for providing first and second voltage signals Vn, Vr, which are complementary to each other, to the first node or a gate node of the transistor Q1. Furthermore, a transistor Q5, having a gate connected to a second node or a gate node of the transistor Q2, for discharging the first node is arranged.

7 Claims, 30 Drawing Sheets

BACKGROUND ART

BACKGROUND ART

F I G . 7
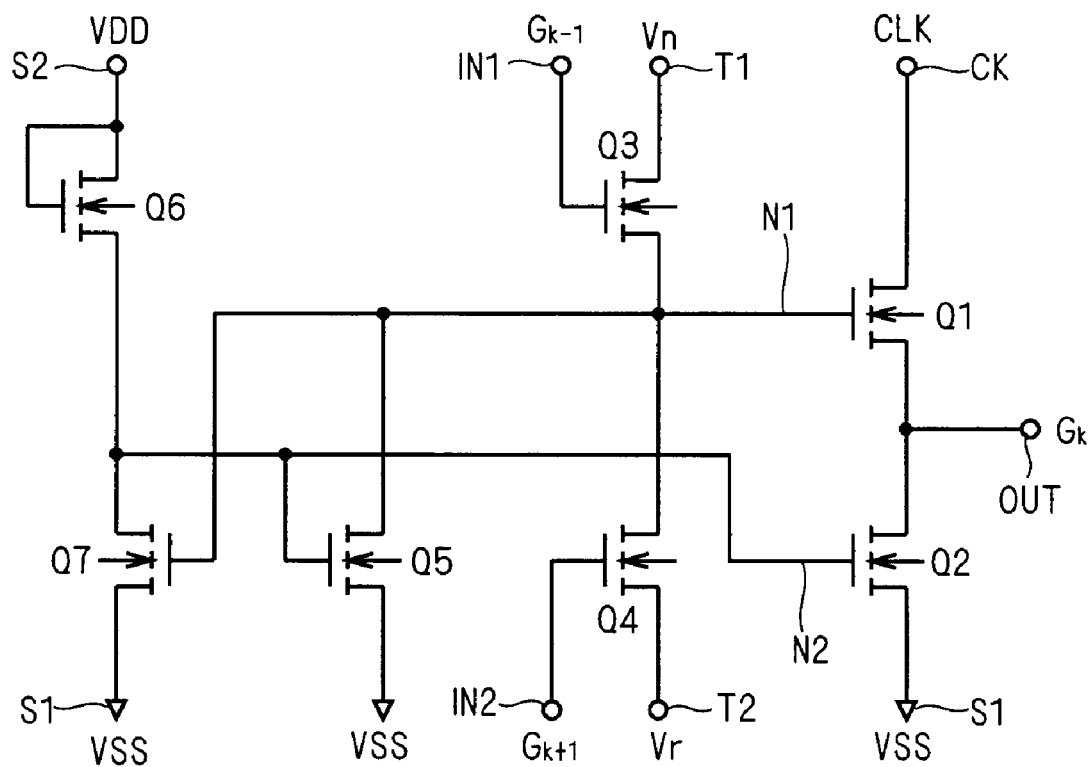

F I G . 9
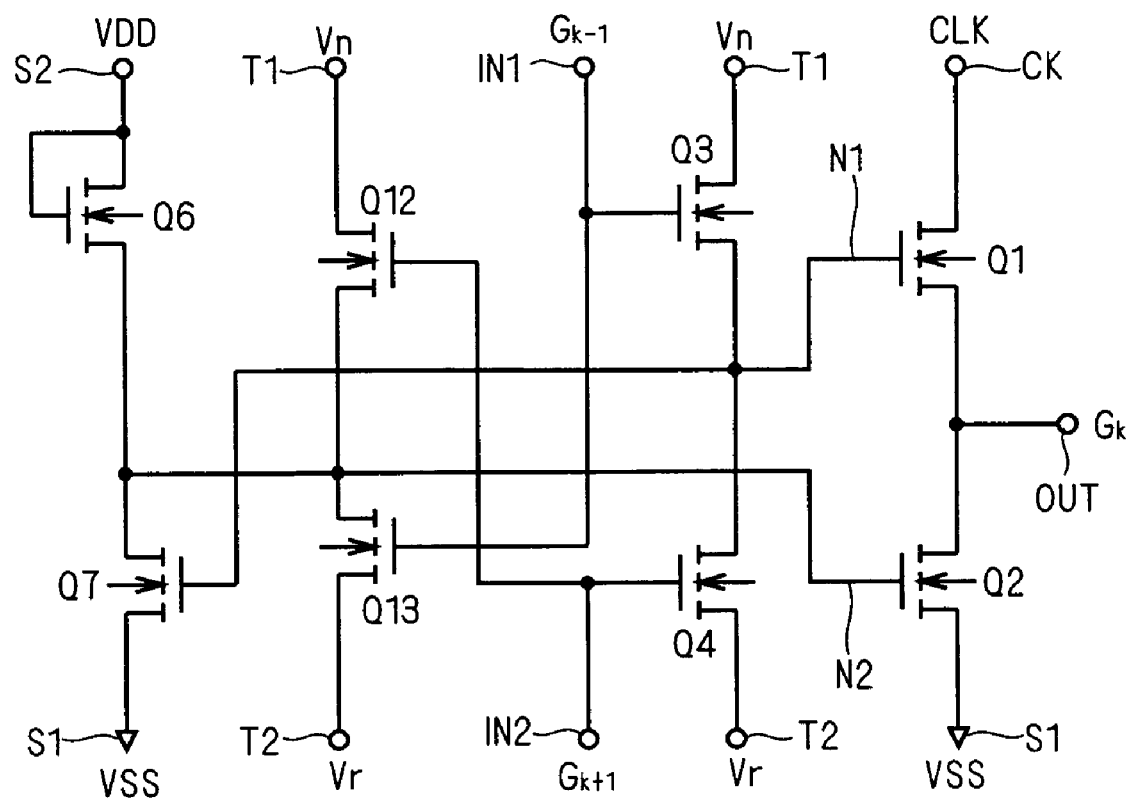

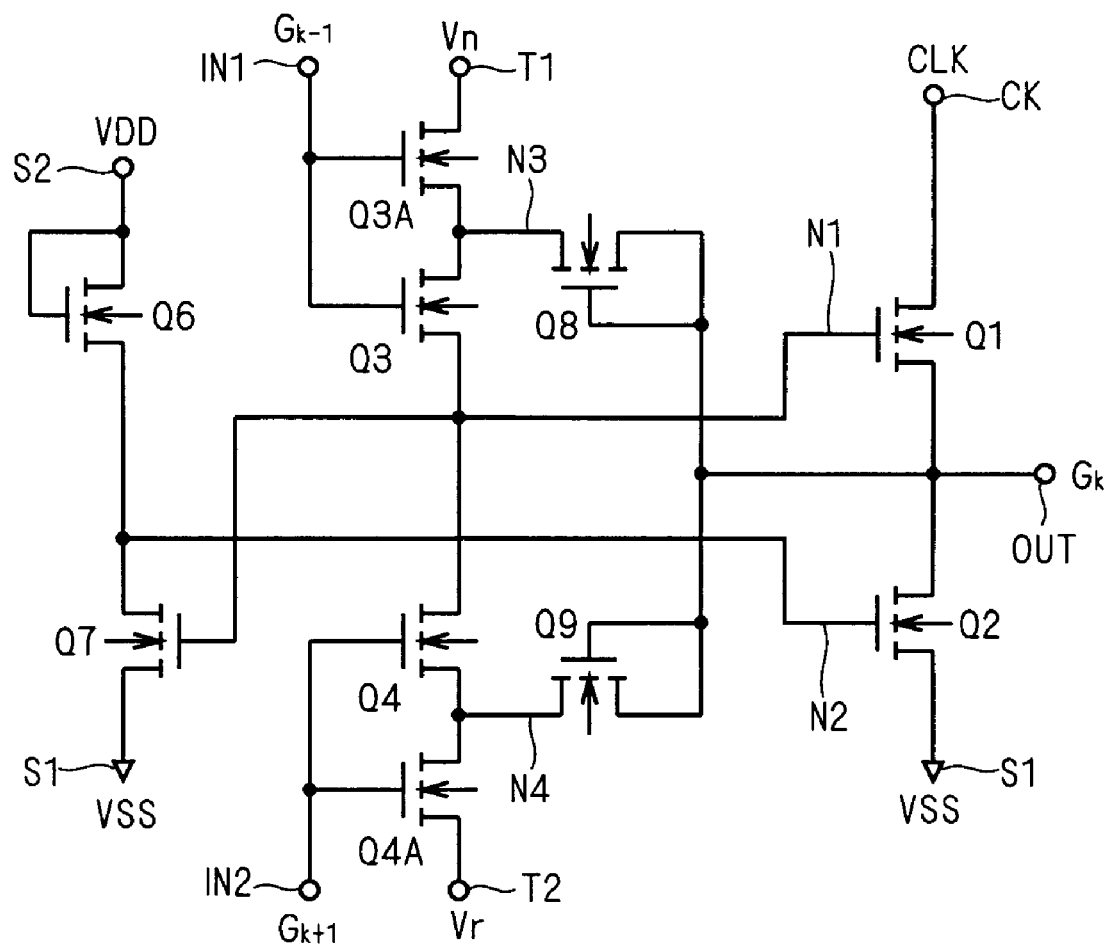
F I G . 1 1

F I G. 1 3
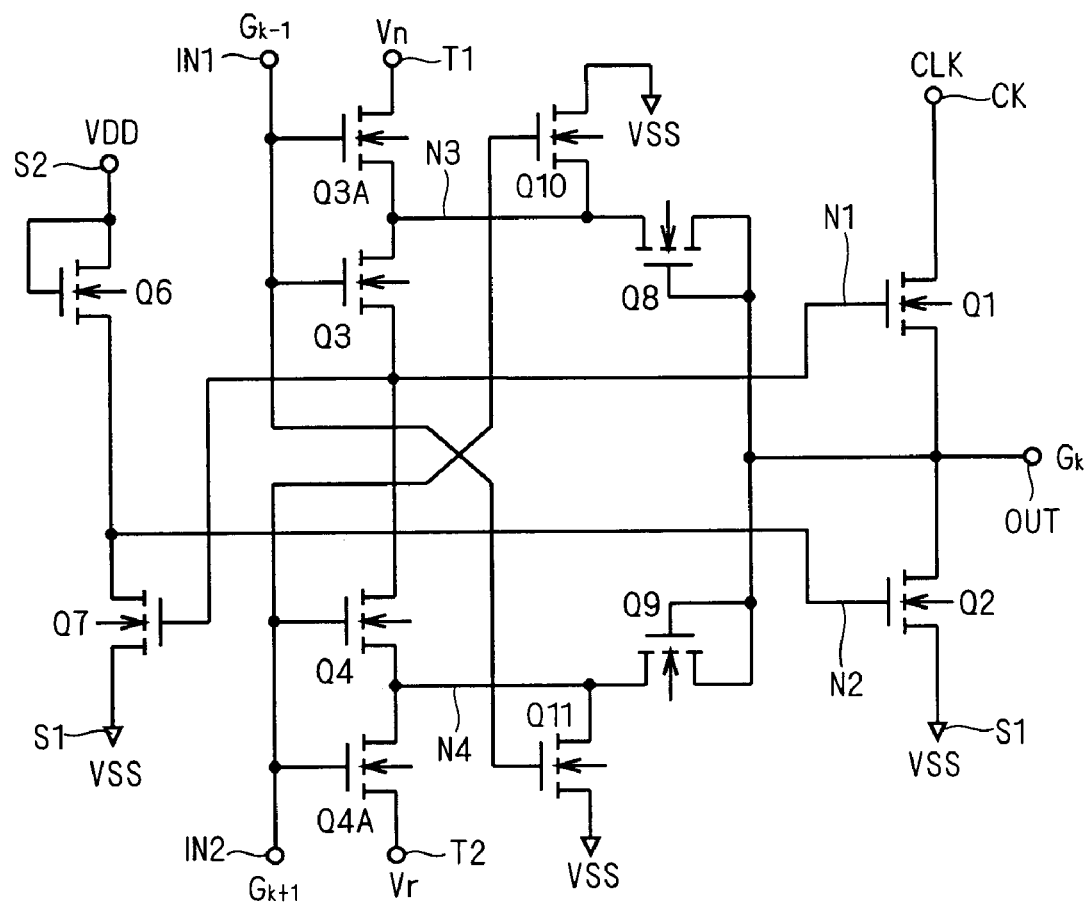

F I G . 1 7
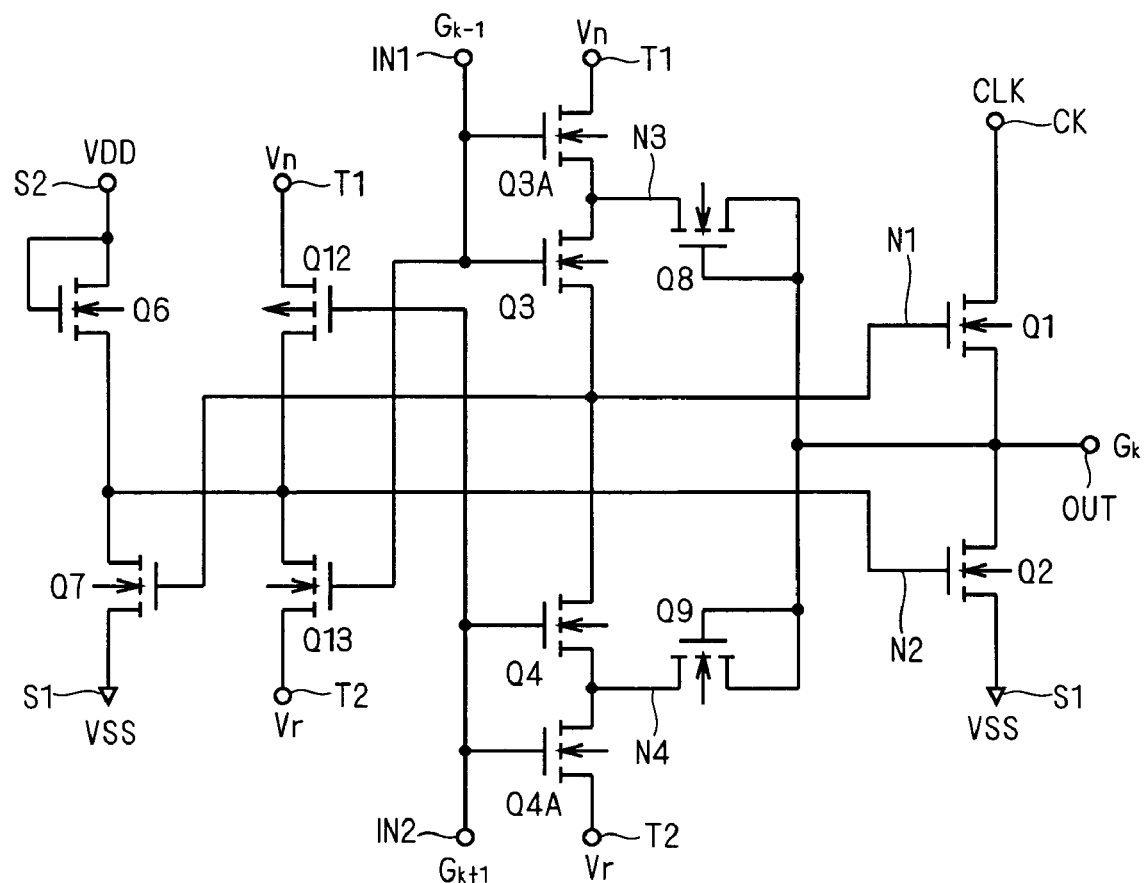

F I G . 1 8
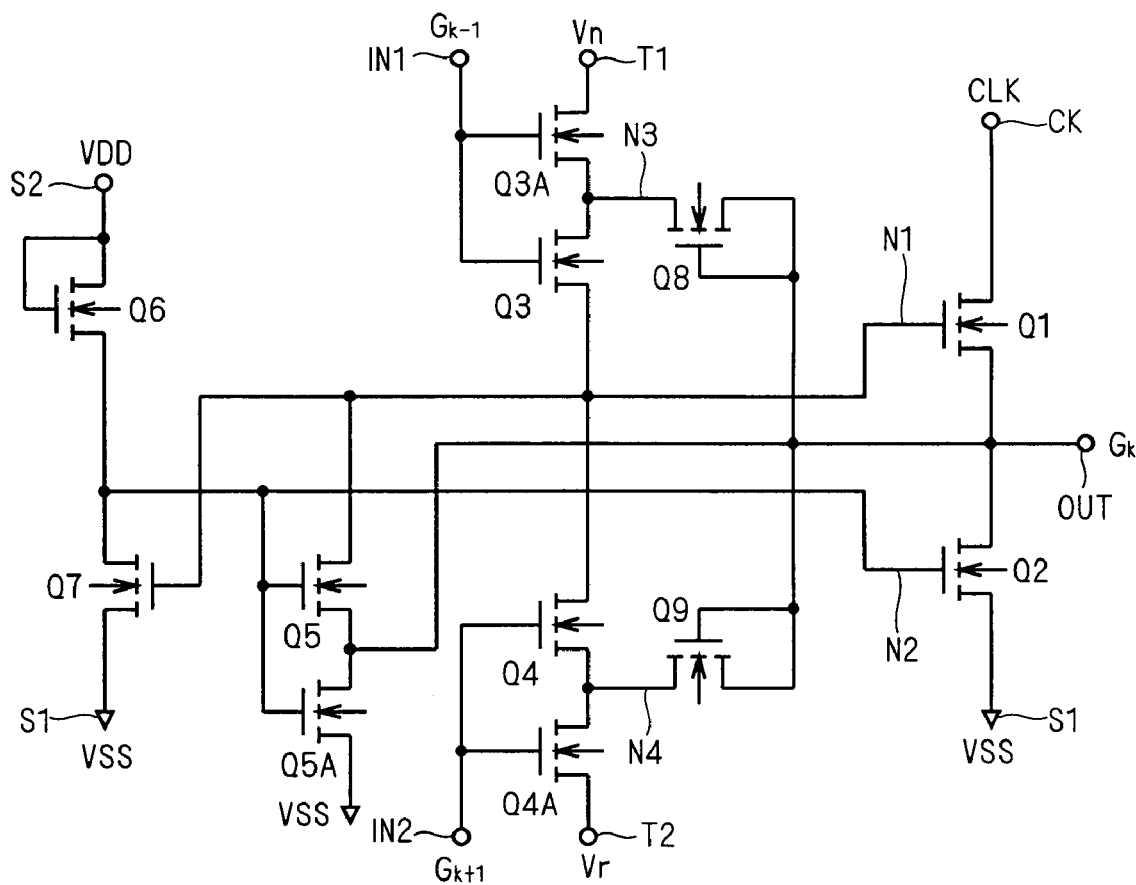

F I G . 1 9
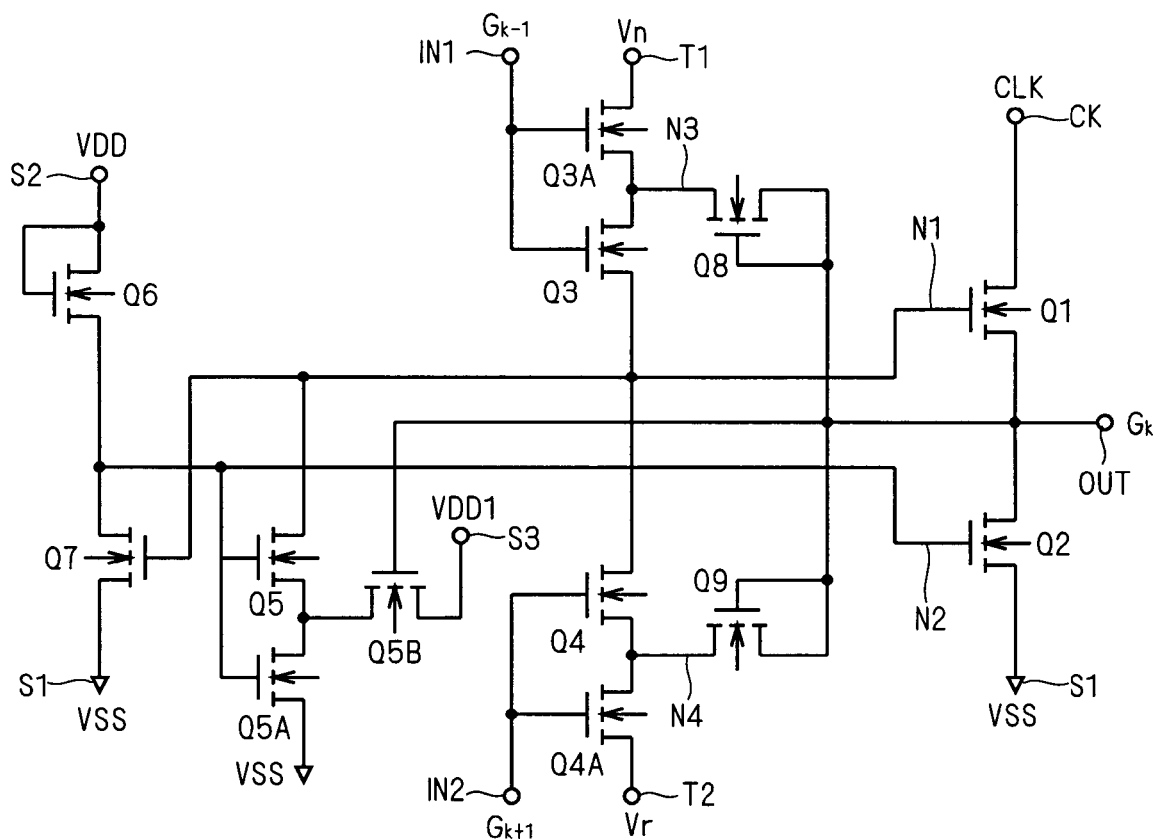

F I G . 2 0
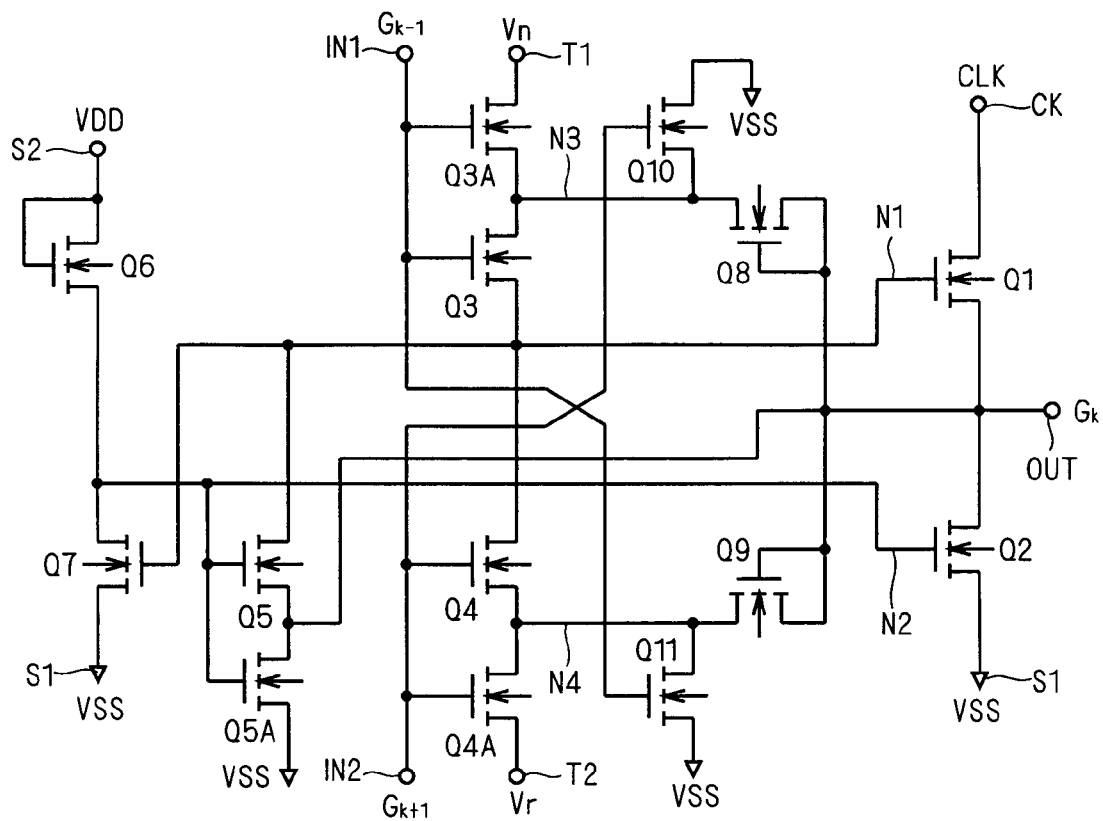

F I G . 2 3
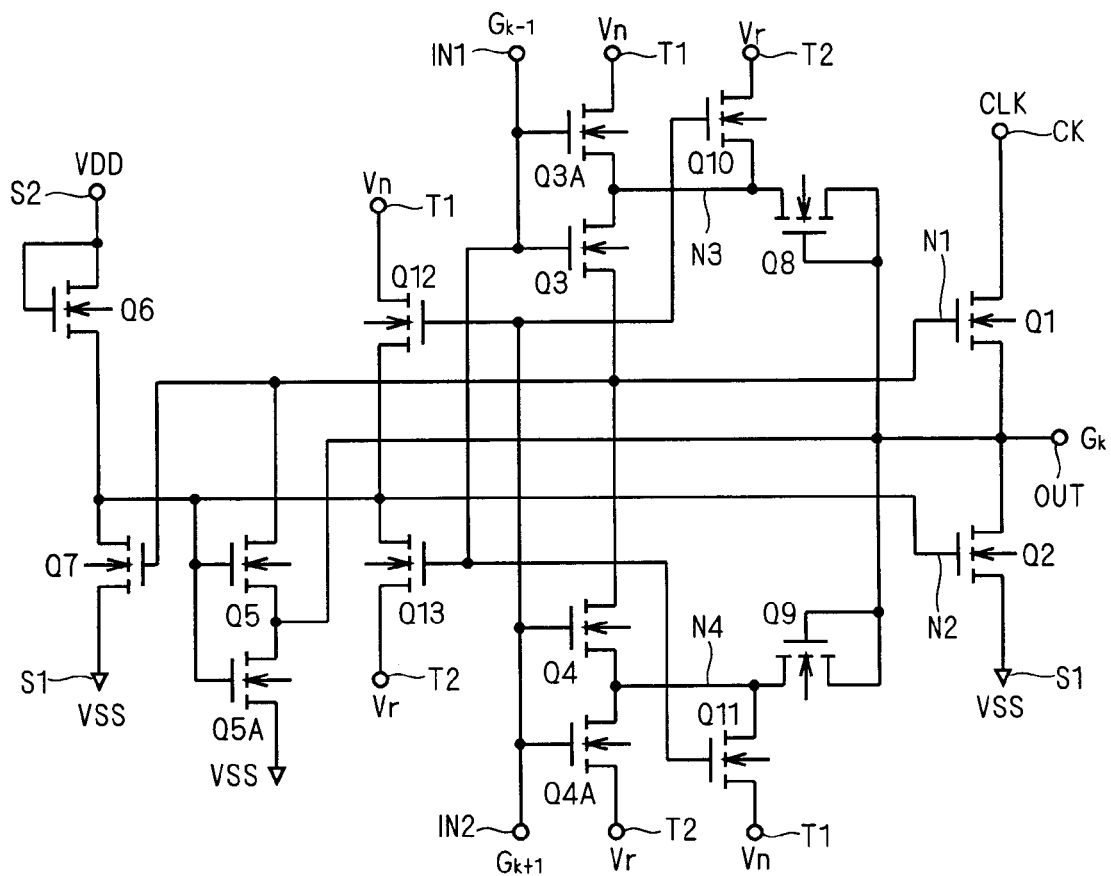

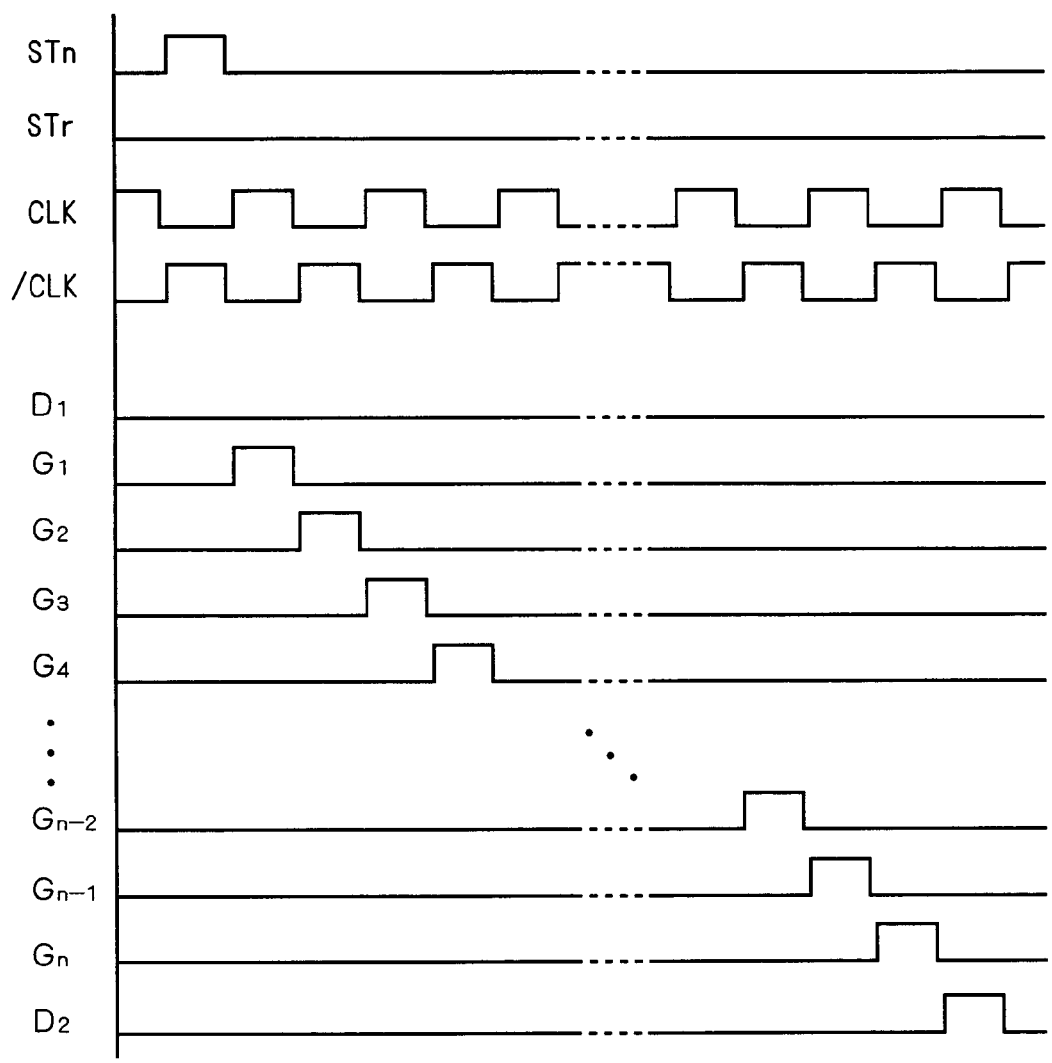
F I G . 2 7

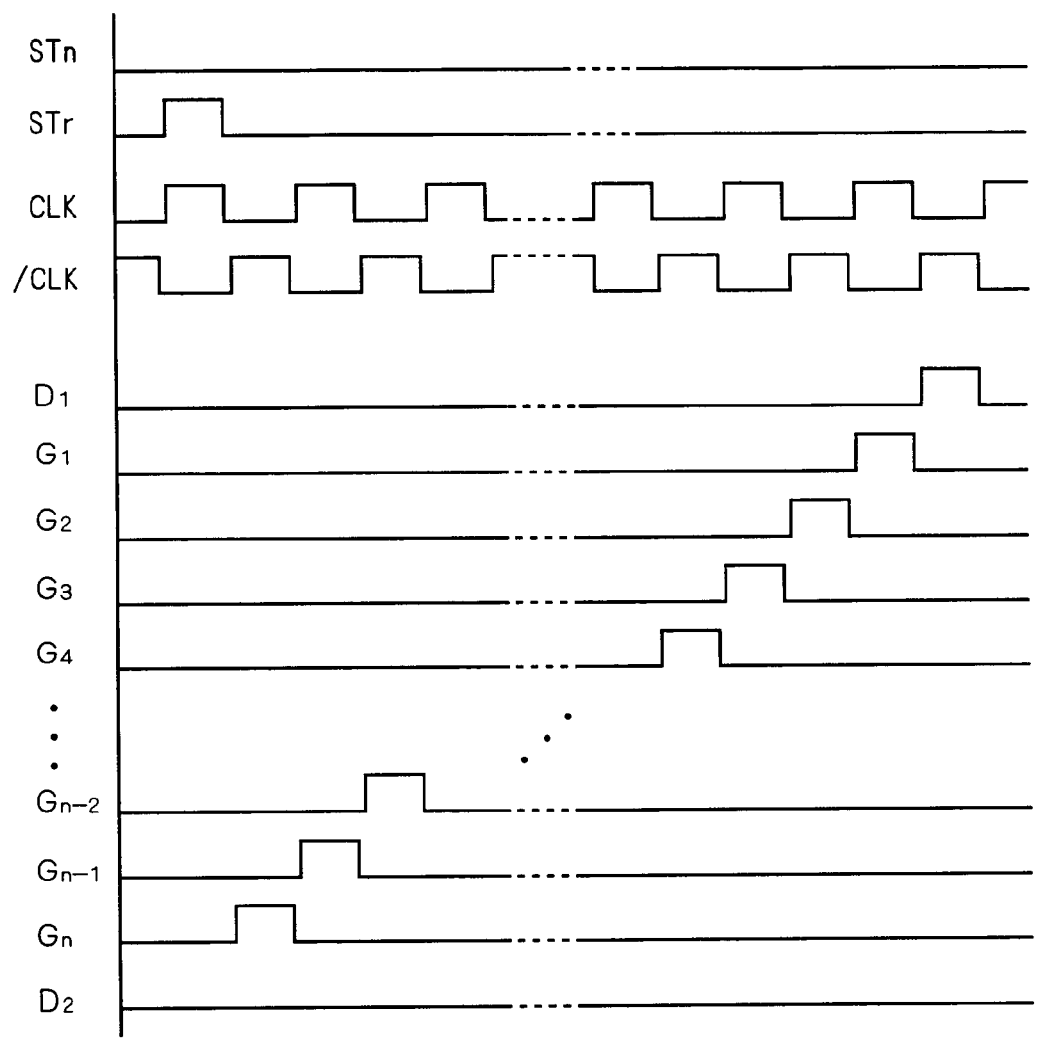

SHIFT REGISTER CIRCUIT AND IMAGE DISPLAY APPARATUS EQUIPPED WITH THE SAME

BACKGROUND OF THE INVENTION

1. Field of the Invention

The present invention relates to shift register circuits configured only by field effect transistors of the same conductivity type used in scanning line driving circuit and the like of the image display apparatus etc., in particular, to a bi-directional shift register in which the direction of shifting the signal can be reversed.

2. Description of the Background Art

In the image display apparatus (hereinafter referred to as "display apparatus"), such as a liquid crystal display apparatus, a gate line (scanning line) is arranged for each pixel row (pixel line) of a display panel in which a plurality of pixels are arrayed in a matrix form, and the gate line is sequentially selected and driven at a cycle of one horizontal period of the display signal to update the displayed image. A shift register for performing the shift operation that completes the round in one frame period of the display signal is used for the gate line driving circuit (scanning line driving circuit) to sequentially select and drive the pixel line, that is, the gate line.

The shift register used in the gate line driving circuit is desirably configured only by the field effect transistors of the same conductivity type in order to reduce the number of steps in the manufacturing process of the display apparatus. Various shift registers configured only by the field effect transistors of N-type or P-type and display apparatuses mounted with the same are proposed. MOS (Metal Oxide Semiconductor) transistor and TFT (Thin Film Transistor) etc. are used as the field effect transistor.

The gate line driving circuit is configured by the shift register comprising a plurality of stages. That is, the gate line driving circuit is configured by cascade connecting a plurality of shift register circuits arranged for every pixel line, that is, every gate line. In the present specification, each of the plurality of shift register circuits configuring the gate line driving circuit is referred to as "unit shift register" for the sake of convenience of the explanation.

In a liquid crystal display apparatus of matrix type in which the liquid crystal pixels are arranged in a matrix form, for example, the request to change the display pattern such as inverting the displayed image upside down or mirror reversing the same and changing the displaying order when displaying is often made.

The display inversion is desired, for example, when applying the liquid crystal display apparatus to an OHP (Overhead Projector) projection apparatus, and using a translucent screen. This is because, when the translucent screen is used, the picture on the screen is inverted as opposed to when projecting the picture from the front side of the screen since the picture is projected from the back side of the screen when seen from the viewer. The change in displaying order is desired when rendition effect is desired in displaying a bar graph, histogram etc. such as gradually appearing the displaying image from the top to the bottom or vice versa, that is, gradually appearing from the bottom to the top.

One method of performing display pattern change of such display apparatus includes switching the shift direction of the signal in the gate line driving circuit. The shift register (hereinafter referred to as "bi-directional shift register") in which the shift direction of the signal can be switched is thus proposed.

For example, the unit shift register (hereinafter also referred to as "bi-directional unit shift register") used in the bi-directional shift register configured only by the field effect transistors of N-channel type is disclosed in FIG. 13 of Japanese Patent Application Laid-Open No. 2001-350438 below (similar circuit is shown in FIG. 3 of the present specification, where the reference number in parentheses below correspond to those in FIG. 3).

The output stage of the unit shift register is configured by a first transistor (Q1) for providing a clock signal (CLK) input to a clock terminal (CK) to an output terminal (OUT), and a second transistor (Q2) for supplying a reference voltage (VSS) to the output terminal. A gate node (N1) of the first transistor is defined as the first node, and a gate node (N2) of the second transistor is defined as the second node.

The unit shift register includes a third transistor (Q3) for providing a first voltage signal (Vn) to the first node based on the signal input to a predetermined first input terminal (IN1), and a fourth transistor (Q4) for providing a second voltage signal (Vr) to the first node based on the signal input to a predetermined second input terminal (IN2). The first and second voltage signals are signals complementary to each other where when one of the voltage level (hereinafter referred to simply as "level") is H (High), the other voltage level is L (Low) level.

The first transistor is driven by the third and fourth transistors. The second transistor is driven by an inverter (Q6, Q7) having the first node as an input end and a second node as an output end. In other words, when the relevant unit shift register outputs the output signal, the first node is at H level due to the operation of the second and third transistors, and the second node is accordingly at L level due to the inverter. The first transistor is thereby turned ON, the second transistor is turned OFF, and the clock signal is transmitted to the output terminal in such state, whereby the output signal is output. If the output signal is not output, on the other hand, the first node is at L level due to the operation of the second and third transistors, and the second node is accordingly at H level due to the inverter. The first transistor is thereby turned OFF, the second transistor is turned ON, and the voltage level of the output terminal is maintained at L level.

If the first voltage signal is at H level and the second voltage signal is at L level, for example, the first node becomes H level and the second node accordingly becomes L level when the signal is input to the first input terminal, whereby the first transistor is turned ON and the second transistor is turned OFF. Therefore, the output signal is output from the relevant unit shift register at a timing the clock signal is subsequently input. In other words, when the first voltage signal is at H level and the second voltage signal is at L level, the relevant unit shift register operates to output the signal input to the first input terminal in a temporally shifted manner.

On the other hand, if the first voltage signal is at L level and the second voltage signal is at H level, the first node becomes H level and the second node accordingly becomes L level when the signal is input to the second input terminal, whereby the first transistor is turned ON and the second transistor is turned OFF. Therefore, the output signal is output from the relevant unit shift register at a timing the clock signal is subsequently input. In other words, when the first voltage signal is at L level and the second voltage signal is at H level, the relevant unit shift register operates to output the signal input to the second input terminal in a temporally shifted manner.

The bi-directional unit shift register of FIG. 13 of Japanese Patent Application Laid-Open No. 2001-350438 (FIG. 3 of the present specification) switches the shift direction of the signal by switching the levels of the first voltage signal and the second voltage signal for driving the first transistor.

A first problem of the conventional bi-directional shift register will be described first. When configuring the gate line driving circuit by cascade connecting the conventional bi-directional unit shift registers, the output signal of the previous stage is input to the first input terminal (IN1) of the unit shift register of each stage, and the output signal of the next stage is input to the second input terminal (IN2) (see FIG. 2 of the present specification). The output signal (gate line driving signal) is output only during one specific horizontal period within one frame period from the respective unit shift register, and is not output during other periods since the gate line driving circuit operates to sequentially select each gate line at a cycle of one frame period. Therefore, the third and fourth transistors (Q3, Q4) driving the first transistor (Q1) are turned OFF most of the time during one frame period in each unit shift register.

In the conventional unit shift register, the gate of the first transistor, that is, the first node (N1) is in the floating state when the third and fourth transistors are turned OFF. In particular, the period (non-selective period) in which the output signal is not output continues for a length of about one frame period, during which period, the first node is maintained at L level of floating state, and the first transistor is maintained in the OFF state. If leakage current is generated in the third transistor (when first voltage signal is at H level) or the fourth transistor (when second voltage signal is at H level), the charges involved therewith accumulates at the first node in the floating state, and the potential of the first node gradually rises.

Furthermore, the clock signal is continuously input to the clock terminal (CK) (drain of first transistor) even during the non-selective period, and the potential of the first node rises while the clock signal is at H level due to coupling via overlapping capacity between drain and gate of the first transistor.

When the potential of the first node rises by the leakage current and the clock signal, the problem of malfunction arises in which the first transistor that is to be turned OFF is turned ON, and the gate line is unnecessarily activated when the voltage between the gate and the source of the first transistor exceeds a threshold voltage. When a pixel switch element (active transistor) arranged on each pixel is turned ON, the data in the pixel is re-written, and display defect occurs.

Next, a second problem will be described. The first node (N1) is at H level of the floating state and the first transistor (Q1) is maintained in the ON state during the period (selective period) the bi-directional unit shift register outputs the output signal. When the clock signal of the clock terminal (CK) (drain of first transistor) becomes H level, the output terminal (OUT) becomes H level following thereto, and the gate line is activated. In this case, the first node is boosted while the clock signal is at H level due to coupling via the drain-gate overlapping capacity, the gate-channel capacity, and the gate-source overlapping capacity of the first transistor. The boost of the first node increases the driving ability (ability to flow current) of the first transistor, whereby the relevant unit shift register charges the gate line at high speed.

However, when the first node is boosted, high voltage is applied between the drain and the source of the third transistor (Q3) (when first voltage signal is at L level) or the fourth transistor (Q4) (when second voltage is at L level), and thus the leakage current tends to be easily generated depending on the voltage resistance property of between the drain and the source. When the level of the first node lowers due to the leakage current, the driving ability of the first transistor lowers, and the falling speed of the output signal of when the clock signal returns from H level to L level becomes slower. If the turning OFF of the pixel transistor is delayed, the data in the pixel may be re-written on the data of the next line, and display failure may occur.

A third problem will be described. In the gate line driving circuit configured by the conventional bi-directional shift register, a control pulse referred as "start pulse" corresponding to the head of each frame of the image signal is input as input signal to the first input terminal (IN1) of the unit shift register of the leading stage in the case of forward shift of shifting the signal in the direction of the previous stage to the subsequent stage and the like. The input signal is sequentially transmitted to each cascade connected unit shift register to the unit shift register of the final stage. In the conventional bi-directional shift register, a control pulse referred to as "end pulse" corresponding to the end of each frame period of the image signal must be input to the second input terminal (IN2) of the final stage immediately after the unit shift register of the final stage outputs the output signal. Otherwise, the first transistor of the final stage cannot be turned OFF, and the output signal continues to be output from the final stage.

In the case of a normal shift register for shifting the signal only in one direction, the end pulse is less likely to become necessary and is sufficiently with the start pulse since a dummy stage is further arranged in the next stage after the final stage and the output signal thereof is used as the end pulse, or the clock signal having a phase different from the clock signal input to the final stage is used as the end pulse. Therefore, most of the drive controlling devices for controlling the operation of the normal gate line driving circuit for shifting the signal (gate line driving signal) only in one direction output only the start pulse.

In the case of the bi-directional shift register, however, the start pulse must be input in the reverse shift to shift the signal in the direction of subsequent stage to previous stage in addition to inputting the end pulse to the second input terminal of the final stage. Furthermore, it is not as simple as with shifting in only one direction since the output signal of the dummy stage may become the wrong start pulse when the shift direction is reversed, if the dummy stage is simply arranged. Therefore, the drive controlling device of the gate line driving circuit for shifting the signal in bi-direction mounted with the output circuit of not only the start pulse but also of the end pulse is adopted, which increases the cost of the drive controlling device, that is, increases the cost of the display apparatus.

A fourth problem will now be described. When the bi-directional shift register is in the selective period as described above, the first node (N1) is at H level, the second node (N2) is at L level, and thus the first transistor (Q1) is turned ON and the second transistor (Q2) is turned OFF. In the forward shift, the first node becomes L level and the first transistor is turned OFF when the output signal of the next stage is input to the second input terminal (IN2) in transitioning from the selective period to the non-selective period. Accordingly, the second node becomes H level by the inverter (Q6, Q7) in the unit shift register, and the second transistor is turned ON.

The parasitic capacity exists between the gate line and the data line of the display panel, and the voltage change of the data line might be added as noise to the gate line, that is, the output terminal (OUT) of the unit shift register due to coupling therethrough. If the second transistor is not sufficiently turned ON in this case, the charges involved in the noise cannot be discharged from the output terminal, whereby the pixel transistor turns ON, and the wrong data may be written to the pixel. Therefore, the potential of the second node (gate of the second transistor) is preferably raised at high speed when transitioning to the non-selective period. To this end, the on-resistance of the transistors (Q6, Q7) configuring the inverter is lowered. However, since the relevant inverter is a ratio type inverter configured by the field effect transistors of the same conductivity type, the pass through current flowing through the inverter when the output of the inverter is at L level increases and the power consumption increases if the on-resistance of the transistor is lowered.

SUMMARY OF THE INVENTION

The first aim of the present invention is to suppress malfunction caused by the leakage current of the constituting transistor in the bi-directional unit shift register. The second aim is to provide a bi-directional shift register in which input of the end pulse is not necessary. Furthermore, the third aim is to reduce the influence of noise added to the output terminal in the bi-directional unit shift register.

The shift register circuit according to a first aspect of the present invention includes first and second input terminals, an output terminal and a clock terminal; as well as first and second voltage signal terminals. The first and second voltage signal terminals are respectively input with first and second voltage signals complementary to each other. The shift register circuit includes the following first to fifth transistors. The first transistor provides a clock signal input to the clock terminal to the output terminal. The second transistor discharges the output terminal. The third transistor provides the first voltage signal to a first node connected with a control electrode of the first transistor based on a first input signal input to the first input terminal. The fourth transistor provides the second voltage signal to the first node based on a second input signal input to the second input terminal. The fifth transistor, having a control electrode connected to the second node connected with the control electrode of the second transistor, discharges the first node.

The transistor Q5 is turned ON and the first node is discharged when the first transistor is turned OFF and the second transistor is turned ON, and thus the first node is maintained at L level even if leakage current is generated at the third and fourth transistors, and malfunction caused by the leakage current is prevented.

The shift register circuit according to a second aspect of the present invention includes first and second input terminals, an output terminal and a clock terminal; as well as first and second voltage signal terminals. The first and second voltage signal terminals are respectively input with first and second voltage signals complementary to each other. The shift register circuit includes the following first to sixth transistors. The first transistor provides a clock signal input to the clock terminal to the output terminal. The second transistor discharges the output terminal. The third transistor provides the first voltage signal to a first node connected with a control electrode of the first transistor based on a first input signal input to the first input terminal. The fourth transistor provides the second voltage signal to the first node based on a second input signal input to the second input terminal. The fifth transistor provides the second voltage signal to a second node connected with a control electrode of the third transistor based on the first input signal. The sixth transistor provides the first voltage signal to the second node based on the second input signal.

The second node is charged and discharged at high speed. In particular, since the second node is charged at high speed, the second transistor is rapidly and sufficiently turned ON and the influence of noise added to the output terminal via the gate line is suppressed when applied to the gate line driving circuit of the display apparatus.

The shift register circuit according to a third aspect of the present invention includes first and second input terminals, an output terminal and a clock terminal; as well as first and second voltage signal terminals. The first and second voltage signal terminals are respectively input with first and second voltage signals complementary to each other. The shift register circuit includes first to sixth transistors and a charging circuit in the following. The first transistor provides a clock signal input to the clock terminal to the output terminal. The second transistor discharges the output terminal. The third transistor provides the first voltage signal to a first node connected with a control electrode of the first transistor based on a first input signal input to the first input terminal. The fourth transistor provides the second voltage signal to the first node based on a second input signal input to the second input terminal. The third transistor connects to the first voltage signal terminal by way of a fifth transistor having a control electrode connected with the control electrode of the third transistor. The fourth transistor connects to the second voltage signal terminal by way of a sixth transistor having a control electrode connected with the control electrode of the fourth transistor. The charging circuit charges a third node, which is a connecting node between the third transistor and the fifth transistor, and a fourth node, which is a connecting node between the fourth transistor and the sixth transistor when the output terminal is activated.

The third and fourth nodes are charged when the output terminal is activated. When the output terminal is activated, the first node is boosted by the coupling via parasitic capacity of the first transistor, but the generation of leakage current of the third and fourth transistors is suppressed since the third and fourth nodes are being charged. Therefore, the potential of the first node is prevented from falling by the leakage current, whereby the problem of lowering in driving ability of the first transistor is resolved.

The shift register circuit according to a fourth aspect of the present invention a shift register comprising a plurality of stages including a first dummy stage at the beginning and a second dummy stage at the end. Each stage includes first and second input terminals, an output terminal and a clock terminal; as well as first and second voltage signal terminals. The first and second voltage signal terminals are respectively input with first and second voltage signals complementary to each other. The shift register circuit includes the following first to fourth transistors. The first transistor provides a clock signal input to the clock terminal to the output terminal. The second transistor discharges the output terminal. The third transistor provides the first voltage signal to a first node connected with a control electrode of the first transistor based on a first input signal input to the first input terminal. The fourth transistor provides the second voltage signal to the first node based on a second input signal input to the second input terminal.

A predetermined first control pulse is input to the first input terminal of the leading stage excluding the first dummy stage, and an output signal of the previous stage is input to the first input terminal of subsequent stage. Furthermore, a predetermined second control pulse is input to the second input terminal of the final stage excluding the second dummy stage, and an output signal of the next stage is input to the second input terminal of the previous stage. The leading stage includes a fifth transistor for discharging the first node of the leading stage based on the output signal of the first dummy stage; and the final stage includes a sixth transistor for discharging the first node of the final stage based on the output signal of the second dummy stage.

The final stage is inactivated by the output signal of the second dummy stage in the forward shift of shifting the signal from the previous stage to the subsequent stage, and the leading stage is inactivated by the output signal of the first dummy stage in the reverse shift of shifting the signal from subsequent stage to previous stage. That is, the output signal of the second dummy stage functions as end pulse in the forward shift, and the output signal of the first dummy stage function as end pulse in the reverse shift. Therefore, the end pulse does not need to be externally input for driving the shift register circuit. That is, the operation of the bi-directional shift is performed using the drive controlling device that does not include an end pulse generation circuit, whereby cost is reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram of a bi-directional unit shift register according to a first embodiment;

FIG. 9 is a circuit diagram of a bi-directional unit shift register according to a second embodiment;

FIG. 11 is a circuit diagram of a bi-directional unit shift register according to a fourth embodiment;

FIG. 13 is a circuit diagram of a bi-directional unit shift register according to a fifth embodiment;

FIG. 17 is a circuit diagram of a bi-directional unit shift register according to an eighth embodiment;

FIG. 18 is a circuit diagram of a bi-directional unit shift register according to the eighth embodiment;

FIG. 19 is a circuit diagram of a bi-directional unit shift register according to the eighth embodiment;

FIG. 20 is a circuit diagram of a bi-directional unit shift register according to the eighth embodiment;

FIG. 23 is a circuit diagram of a bi-directional unit shift register according to the eighth embodiment;

FIG. 27 is a timing chart showing the operation of the gate line driving circuit according to the ninth embodiment;

FIG. 28 is a timing chart showing the operation of the gate line driving circuit according to the ninth embodiment;

DESCRIPTION OF THE PREFERRED EMBODIMENTS

Figure 1:
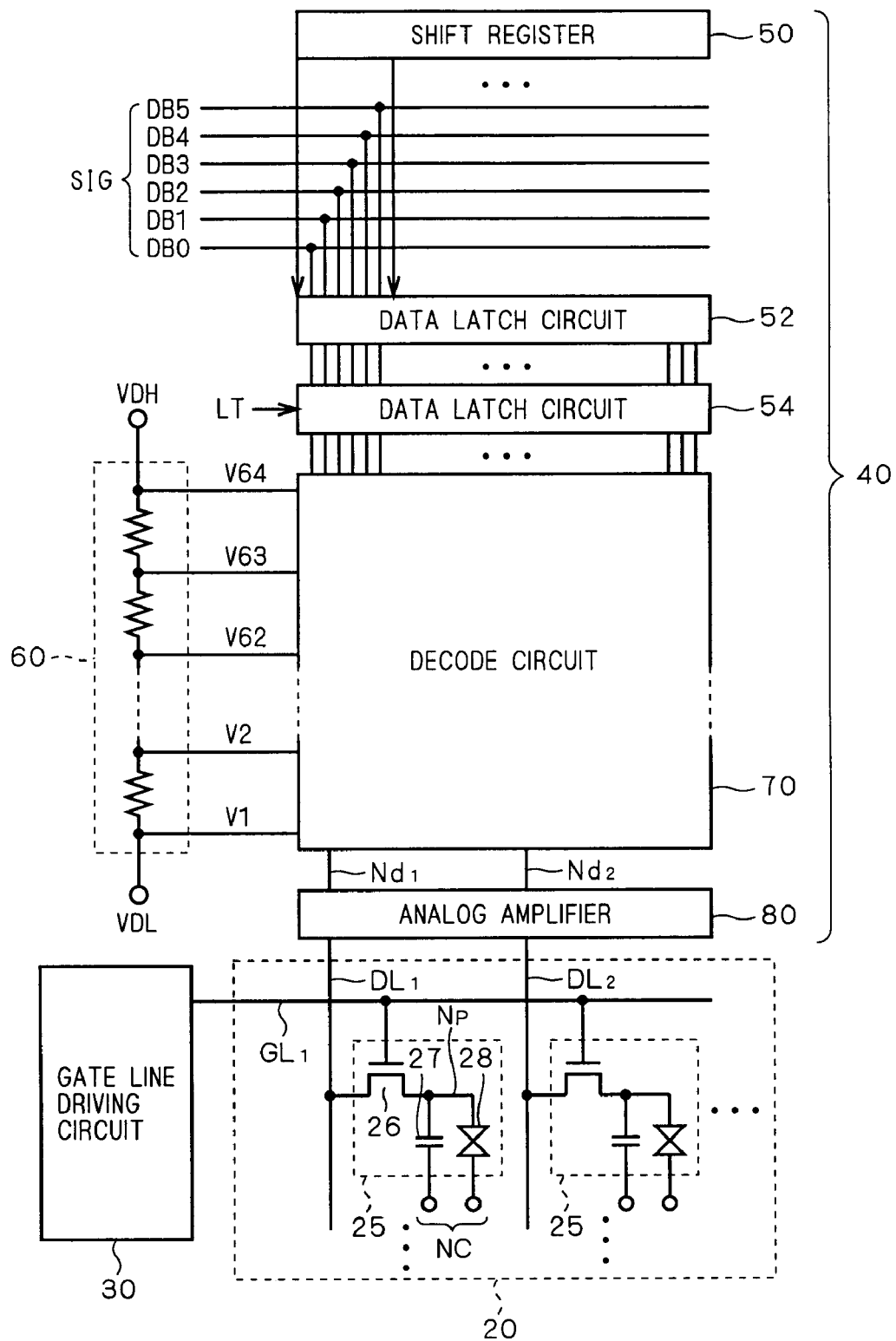
FIG. 1 is a schematic block diagram showing a configuration of a display apparatus according to an embodiment of the present invention.

The embodiments of the present invention will now be described with reference to the drawings. The same reference characters are denoted for elements having same or corresponding functions throughout the drawings to avoid redundant explanation.

First Embodiment

FIG. 1 is a schematic block diagram showing the configuration of a display apparatus according to a first embodiment of the present invention, showing the entire configuration of a liquid crystal display apparatus 10 as one example of the display apparatus.

The liquid crystal display apparatus 10 includes a liquid crystal array section 20, a gate line driving circuit (scanning line driving circuit) 30, and a source driver 40. As to be apparent from the description below, the bi-directional shift register according to the embodiment of the present invention is mounted on the gate line driving circuit 30, and is integrally formed with the liquid crystal array section 20.

The liquid crystal array section 20 includes a plurality of pixels 25 arranged in a matrix form. The gate lines $GL_1$, $GL_2$, . . . (collectively referred to as "gate line GL") are arranged on each row of pixels (hereinafter referred to also as "pixel line"), and the data lines $DL_1$, $DL_2$, . . . (collectively referred to as "data line DL") are arranged on each column of pixels (hereinafter referred to also as "pixel column"). FIG. 1 shows the pixels 25 in first and second columns on the first row, and the gate line $GL_1$ as well as the data lines $DL_1$, $DL_2$ corresponding thereto by way of example.

Each pixel 25 includes a pixel switch element 26 arranged between the corresponding data line DL and the pixel node Np, and a capacitor 27 and a liquid crystal display element 28 connected in parallel between the pixel node Np and a common electrode node NC. The orientation of the liquid crystals in the liquid crystal display element 28 changes according to the voltage difference between the pixel node Np and the common electrode node NC, and the display luminance of the liquid crystal display element 28 changes in response thereto. Thus, the luminance of each pixel can be controlled by the display voltage transmitted to the pixel node Np via the data line DL and the pixel switch element 26. In other words, the intermediate luminance can be obtained by applying the intermediate voltage difference between the voltage difference corresponding to the maximum luminance and the voltage difference corresponding to the minimum luminance to between the pixel node Np and the common electrode node NC. Therefore, the tone-wise luminance can be obtained by setting the display voltage in a step-wise manner.

The gate line driving circuit 30 selects and drives the gate line GL in order based on a predetermined scanning period. In the present embodiment, the gate line driving circuit 30 is configured by a bi-directional shift register in which the direction of the order of activating the gate line GL can be switched. The gate electrodes of the pixel switch element 26 are connected to the corresponding gate lines GL. While a specific gate line GL is being selected, the pixel switch element 26 is in the electrically conducting state at each pixel connected to the relevant gate line, and the pixel node Np is connected to the corresponding data line DL. The display voltage transmitted to the pixel node Np is held by the capacitor 27. Generally, the pixel switch element 26 is configured by the TFT formed on the same insulation substrate (glass substrate, resin substrate etc.) as the liquid crystal display element 28.

The source driver 40 is provided to output the display voltage set in a step-wise manner by the display signal SIG, which is the digital signal of N bits, to the data line DL. The display signal SIG is a signal of 6 bits, and is configured by display signal bits DB0 to DB5, by way of example. $2^6$=64 steps of tone display is possible in each pixel based on the display signal SIG of 6 bits. Furthermore, if one color display unit is formed by three pixels of R (Red), G (Green) and B (Blue), color display of about 260 thousand colors becomes possible.

As shown in FIG. 1, the source driver 40 includes a shift register 50, data latch circuits 52, 54, a tone voltage generation circuit 60, a decode circuit 70, and an analog amplifier 80.

The display signal bits DB0 to DB5 corresponding to the display luminance of each pixel 25 are serially generated in the display signal SIG. That is, the display signal bits DB0 to DB5 at each timing indicate the display luminance at one of the pixels 25 in the liquid crystal array section 20.

The shift register 50 instructs the retrieval of the display signal bits DB0 to DB5 to the data latch circuit 52 at a timing synchronized with the period the setting of the display signal SIG is switched. The data latch circuit 52 retrieves the serially generated display signal SIG one by one, and holds the display signal SIG worth of one pixel line.

A latch signal LT input to the data latch circuit 54 is activated at a timing the display signal SIG worth of one pixel line is retrieved by the data latch circuit 52. In response thereto, the data latch circuit 54 retrieves the display signal SIG worth of one pixel line held in the data latch circuit 52 at the relevant time.

The tone voltage generation circuit 60 is configured by 63 voltage dividing resistors connected in series between high voltage VDH and low voltage VDL, and generates tone voltages V1 to V64 of 64 steps.

The decode circuit 70 decodes the display signal SIG held in the data latch circuit 54, and selects and outputs the voltage to be output to each decode output node Nd$_1$, Nd$_2$, . . . (collectively referred to as "decode output node Nd") based on the decoded result from the tone voltages V1 to V64.

As a result, the display voltage (one of the tone voltages V1 to V64) corresponding to the display signal SIG worth of one pixel line held in the data latch circuit 54 is simultaneously (in parallel) output to the decode output node Nd. In FIG. 1, the decode output nodes Nd$_1$, Nd$_2$ corresponding to the data lines DL$_1$, DL$_2$ of the first and second columns are shown by way of example.

The analog amplifier 80 outputs the analog voltage corresponding to each display voltage output to the decode output nodes Nd$_1$, Nd$_2$, from the decode circuit 70 to each data line DL$_1$, DL$_2$, . . . .

The source driver 40 repeatedly outputs the display voltage corresponding to a series of display signal SIG to the data line DL by one pixel line based on the predetermined scanning period, and the gate line driving circuit 30 drives the gate lines GL$_1$, GL$_2$, . . . in this order or in the reverse order in synchronization with the scanning period, thereby displaying the image or the inverted image based on the display signal SIG on the liquid crystal array section 20.

Figure 2:
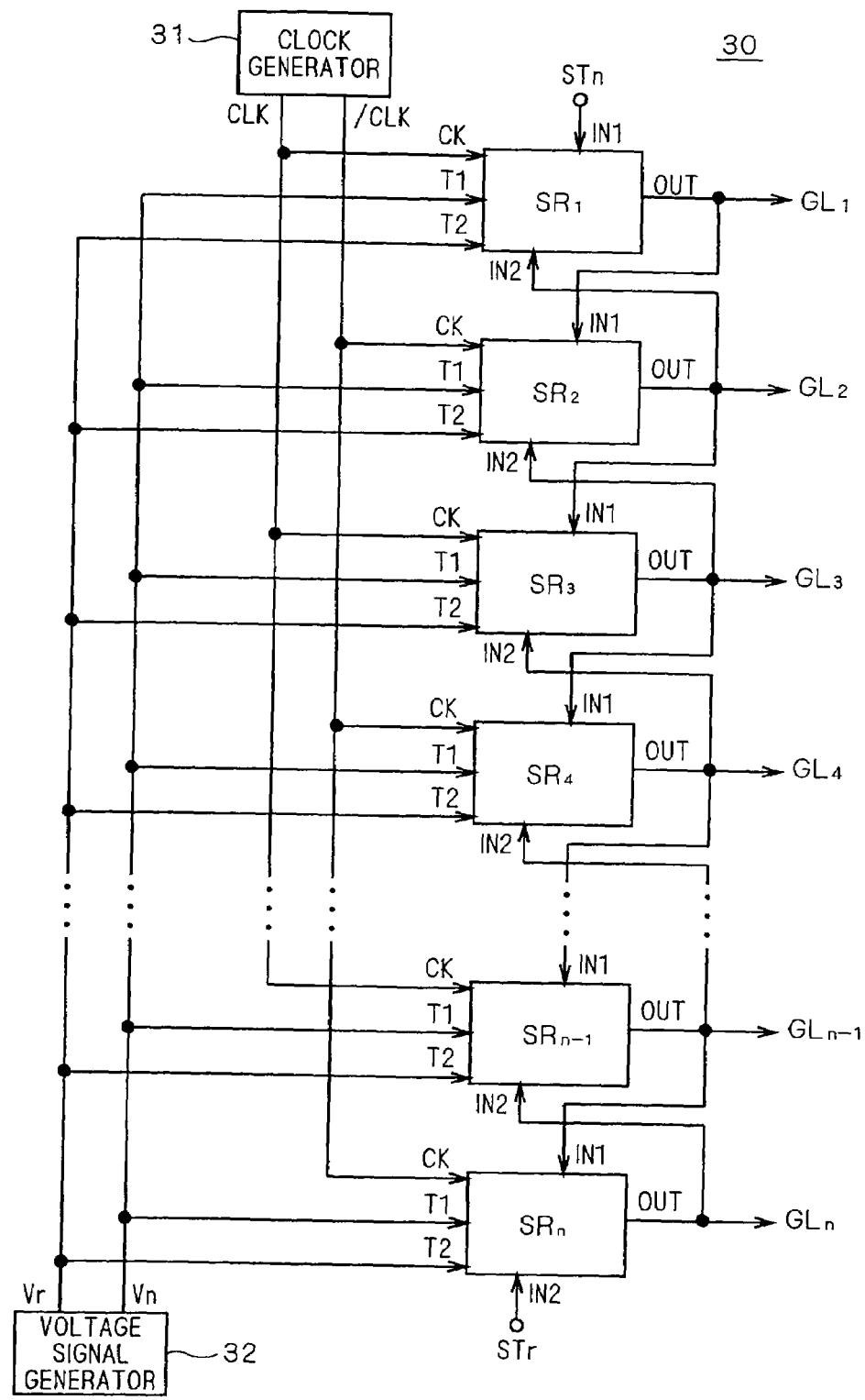
FIG. 2 is a block diagram showing a configuration example of a gate line driving circuit using a bi-directional unit shift register.

FIG. 2 shows a view showing a configuration of the gate line driving circuit 30. The gate line driving circuit 30 is configured by the bi-directional shift register comprising a plurality of stages. That is, the relevant gate line driving circuit 30 includes n cascade connected bi-directional unit shift registers SR$_1$, SR$_2$, SR$_3$, . . . , SR$_n$ (the unit shift registers SR$_1$, SR$_2$, SR$_3$, . . . , SR$_n$ hereinafter collectively referred to as "unit shift register SR"). One unit shift register SR is arranged for one pixel line, that is, one gate line GL.

A clock generator 31 shown in FIG. 2 inputs two phase clock signals CLK, /CLK having phases different from each other to the unit shift register SR of the gate line driving circuit 30. The clock signals CLK, /CLK are controlled so as to be alternately activated at the timing synchronized with the scanning period of the display apparatus.

A voltage signal generator 32 shown in FIG. 2 generates a first voltage signal Vn and a second voltage signal Vr to determine the shift direction of the signal in the bi-directional shift register. The voltage signal generator 32 has the first voltage signal Vn at H level and the second voltage signal Vr at L level when shifting the signal in the direction from the previous stage to the subsequent stage (order of unit shift registers SR$_1$, SR$_2$, SR$_3$, . . . , SR$_n$) (this direction is defined as "forward direction"). On the contrary, the second voltage signal Vr is at H level and the first voltage signal Vn is at L level when shifting the signal in the direction from the subsequent stage to the previous stage (order of unit shift registers SR$_n$, SR$_{n-1}$, SR$_{n-2}$, . . . ) (this direction is defined as "reverse direction").

Each unit shift register SR includes a first input terminal IN1, a second input terminal IN2, an output terminal OUT, a clock terminal CK, a first voltage signal terminal T1 and a second voltage signal terminal T2. One of the clock signals CLK, /CLK is input so that the clock signal different from the unit shift register SR adjacent before and after is input to the clock terminal CK of each unit shift register SR, as shown in FIG. 2.

The clock signals CLK, /CLK generated by the clock generator 31 are able to interchange the phase with each other according to the shift direction of the signal by program or by change of connection of the wiring. Interchange by change of connection of the wiring is effective when fixing the shift direction to one direction before manufacturing the display apparatus. Interchange by program is effective when fixing the shift direction to one direction after manufacturing the display apparatus or allowing the shift direction to be changed while using the display apparatus.

The gate line GL is connected to the output terminal OUT of the unit shift register SR. In other words, the signal (output signal) output to the output terminal OUT becomes a horizontal (or vertical) scanning pulse for activating the gate line GL.

A first control pulse STn is input to the first input terminal IN1 of the unit shift register SR1 of the first stage, which is the leading stage. The first control pulse STn becomes the start pulse corresponding to the head of each frame period of the image signal in the forward shift, and becomes the end pulse corresponding to the end of each frame period of the image signal in the reverse shift. The first input terminal IN1 of the unit shift register SR of the second and subsequent stages is connected to the output terminal OUT of the unit shift register SR of the previous stage. That is, the output signal of the previous stage is input to the first input terminal IN1 of the unit shift register SR for the second and subsequent stages.

The second control pulse STr is input to the second input terminal IN2 of the $n^{th}$ ($n^{th}$ stage) unit shift register SRn, which is the final stage. The second control pulse STr becomes the start pulse in the reverse shift, and becomes the end pulse in the forward shift. The second input terminal IN2 before n-$1^{th}$ stage is connected to the output terminal OUT of the subsequent stage. That is, the output signal of the subsequent stage is input to the second input terminal IN2 of the second and subsequent stages.

Each unit shift register SR transmits the input signal (output signal of previous stage) input from the previous stage to the corresponding gate line GL and the unit shift register SR of the next stage while shifting the same in the forward shift in synchronization with the clock signals CLK, /CLK. In the reverse shift, the input signal (output signal of subsequent stage) input from the subsequent stage is transmitted to the corresponding gate line GL and the unit shift register SR of the previous stage while shifting the same (operation of the unit shift register SR to be hereinafter described in detail). As a result, a series of unit shift registers SR function as a so-called gate line driving unit for sequentially activating the gate line GL at the timing based on a predetermined scanning period.

Figure 3:
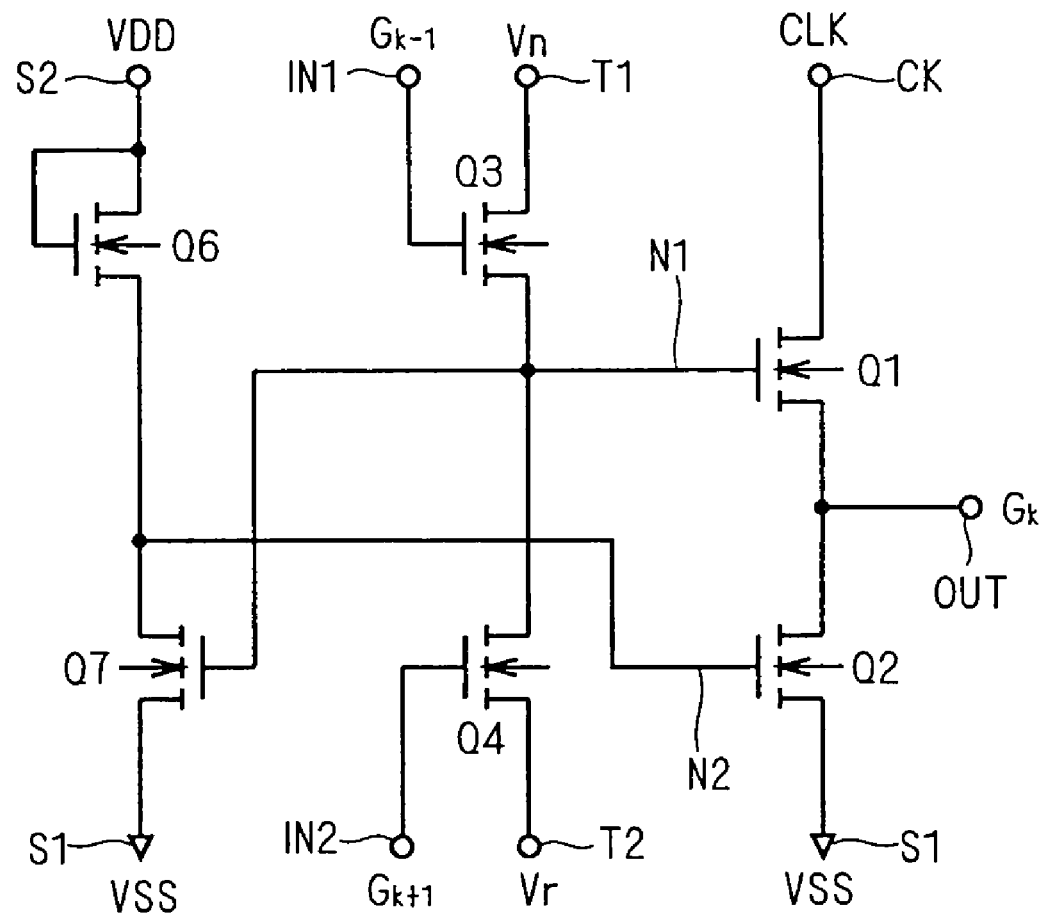
FIG. 3 is a circuit diagram of a conventional bi-directional unit shift register.

The conventional bi-directional unit shift register will now be described to simplify the description of the present invention. FIG. 3 is a circuit diagram showing a configuration of the conventional bi-directional unit shift register SR, similar to that disclosed in Japanese Patent Application Laid-Open No. 2001-350438 (Pages. 13-19, FIGS. 13 to 25). The configuration of each cascade connected unit shift register SR is substantially all the same in the gate line driving circuit 30, and thus only the configuration of one unit shift register SR will be described below by way of example. The transistors configuring the unit shift register SR are all field effect transistors of the same conductivity type but are assumed to be all N-type TFT in the present embodiment.

As shown in FIG. 3, the conventional bi-directional unit shift register SR includes a first power supply terminal S1 supplied with low potential side power supply potential VSS and a second power supply terminal S2 supplied with high potential side power supply potential VDD in addition to the first and second input terminals IN1, IN2, the output terminal OUT, the clock terminal CK, and first and second voltage signal terminals T1, T2, as already shown in FIG. 2. In the following description, the low potential side power supply potential VSS is assumed as the reference potential (=0V) of the circuit, but in actual use, the reference potential is set with the voltage of the data written to the pixel as the reference, and for example, the high potential side power supply potential VDD is set at 17V and the low potential side power supply potential VSS is set at −12V etc.

The output stage of the unit shift register SR is configured by a transistor Q1 connected between the output terminal OUT and the clock terminal CK, and a transistor Q2 connected between the output terminal OUT and the first power supply terminal S1. That is, the transistor Q1 is an output pull-up transistor for supplying the clock signal input to the clock terminal CK to the output terminal OUT, and the transistor Q2 is an output pull-down transistor for supplying the potential of the first power supply terminal S1 to the output terminal OUT. The node connected by the gate (control electrode) of the transistor Q1 configuring the output stage of the unit shift register SR is defined as node N1 and the gate node of the transistor Q2 as node N2.

A transistor Q3 is connected between the node N1 and the first voltage signal terminal T1, the gate of which is connected to the first input terminal IN1. A transistor Q4 is connected between the node N1 and the second voltage signal terminal T2, the gate of which is connected to the second input terminal IN2.

A transistor Q6 is connected between the node N2 and the second power supply terminal S2, and a transistor Q7 is connected between the node N2 and the first power supply terminal S1. The gate of the transistor Q6 is connected to the second power terminal S2 similar to the drain, or is a so-called diode connected. The gate of the transistor Q7 is connected to the node N1. The transistor Q7 has a driving ability (ability to flow current) set sufficiently higher than the transistor Q6. That is, the on-resistance of the transistor Q7 is smaller than the on-resistance of the transistor Q6. Thus, when the gate potential of the transistor Q7 rises, the potential of the node N2 lowers, whereas when the gate potential of the transistor Q7 lowers, the potential of the node N2 rises. That is, the transistor Q6 and the transistor Q7 configure an inverter having the node N1 as the input end and node N2 as the output end. The relevant inverter is a so-called "ratio type inverter", in which the operation is defined by the ratio of the on-resistance values of the transistor Q6 and the transistor Q7. The inverter functions as a "pull-down driving circuit" for driving the transistor Q2 to pull-down the output terminal OUT.

The operation of the unit shift register SR of FIG. 3 will now be described. The operation of each unit shift register SR configuring the gate line driving circuit 30 is substantially all the same, and thus the operation of the $k^{th}$ unit shift register $SR_k$ will be described herein by way of example.

The following description is given assuming the clock signal CLK is input to the clock terminal CK of the relevant shift register $SR_k$ for the sake of simplification (e.g., correspond to unit shift register $SR_1$, $SR_3$ etc. in FIG. 2). Furthermore, the output signal of the relevant unit shift register $SR_k$ is defined as $G_k$, the output signal of the unit shift register $SR_{k-1}$ of the previous stage (k−1 stage) as $G_{k-1}$, and the output signal of the unit shift register $SR_{k+1}$ of the next stage (k+1 stage) as $G_{k+1}$. The potential of H level of the clock signals CLK, /CLK, the first voltage signal Vn, and the second voltage signal Vr is assumed to be equal to the high potential side power supply potential VDD. Moreover, the threshold voltage of each transistor configuring the unit shift register SR is assumed to be all the same, where the value thereof is Vth.

A case in which the gate line driving circuit 30 performs the operation of the forward shift will be described first. The voltage signal generator 32 has the first voltage signal Vn at H level (VDD) and the second voltage signal Vr at L level (VSS). That is, the transistor Q3 functions as a transistor for charging (pulling up) the node N1, and the transistor Q4 functions as a transistor for discharging (pulling down) the node N1 in the forward shift.

The node N1 is assumed to be at L level (VSS) and the node N2 at H level (VDD-Vth) in the initial state (this state is hereinafter referred to as "reset state"). The clock terminal CK (clock signal CLK), the first input terminal IN1 (output signal $G_{k-1}$ of previous stage) and the second input terminal IN2 (output signal $G_{k+1}$ of next stage) are all assumed to be at L level. Since the transistor Q1 is turned OFF (shielded state), and the transistor Q2 is turned ON (electrically conducted state) in the reset state, the output terminal OUT (output signal Gk) is maintained at L level irrespective of the level of the clock terminal CK (clock signal CLK). That is, the gate line GLk to be connected with the relevant unit shift register $SR_k$ is in the non-selective state.

When the output signal $G_{k-1}$ of the unit shift register $SR_{k-1}$ of the previous stage (first control pulse STn serving as start pulse for the first stage) becomes H level from the above state, the relevant output signal is input to the first input terminal IN1 of the relevant unit shift register $SR_k$ and the transistor Q3 is turned ON, and the node N1 becomes H level (VDD). The transistor Q7 is accordingly turned ON, and thus the node N2 becomes L level (VSS). In the state in which the node N1 is at H level and the node N2 is at L level (this state is hereinafter referred to as "set state"), the transistor Q1 is turned ON and the transistor Q2 is turned OFF. Subsequently, when the output signal $G_{k-1}$ of the previous stage returns to L level, the transistor Q3 is turned OFF, but the node N1 becomes H level of the floating state, and thus the set state is maintained.

Subsequently, the clock signal CLK input to the clock terminal CK becomes H level, but since the transistor Q1 is turned ON and the transistor Q2 is turned OFF at this point, the level of the output terminal OUT rises therewith. The level of the node N1 in the floating state is boosted by a predetermined voltage due to coupling via gate-channel capacity of the transistor Q1. Therefore, the driving ability of the transistor Q1 is maintained high even if the level of the output terminal OUT rises, and thus the level of the output signal $G_k$ changes following the level of the clock terminal CK. In particular, when the gate-source voltage of the transistor Q1 is sufficiently large, the transistor Q1 performs the operation in the non-saturated region (non-saturated operation), and thus the loss worth of threshold voltage does not exist, and the output terminal OUT rises to the same level as the clock signal CLK. Therefore, the output signal $G_k$ becomes H level by the period the clock signal CLK is at H level, and the gate line $GL_k$ is activated and in the selected state.

Subsequently, when the clock signal CLK returns to L level, the output signal $G_k$ also becomes L level following thereto, and the gate line $GL_k$ is discharged and returned to the non-selected state.

The output signal $G_k$ is input to the first input terminal IN1 of the next stage, and thus the output signal $G_{k+1}$ of the next stage becomes H level at the timing the clock signal /CLK becomes H level. The transistor Q4 of the relevant unit shift register $SR_k$ is thus turned ON, and the node N1 becomes L level. The transistor Q7 is accordingly turned OFF and the node N2 becomes H level. That is, the state returns to the reset state in which the transistor Q1 is turned OFF, and the transistor Q2 is turned ON.

Subsequently, when the output signal $G_{k+1}$ of the next stage returns to L level, the transistor Q4 is turned OFF, but since the transistor Q3 is also turned OFF at this point, the node N1 becomes the floating state, and the L level is maintained. This state continues until the signal is input to the first input terminal IN1, and the relevant unit shift register $SR_k$ is maintained in the reset state.

Summarizing the operation of the forward shift described above, the unit shift register SR maintains the reset state while the signal (start pulse or output signal $G_{k-1}$ of the previous stage) is not input to the first input terminal IN1. Since the transistor Q1 is turned OFF and the transistor Q2 is turned ON in the reset state, the output terminal OUT (gate line $GL_k$) is maintained at L level (VSS) of low impedance. When the signal is input to the first input terminal IN1, the unit shift register SR switches to the set state. Since the transistor Q1 is turned ON and the transistor Q2 is turned OFF in the set state, the output terminal OUT becomes H level and the output signal $G_k$ is output during the period the signal (clock signal CLK) of the clock terminal CK is at H level. Thereafter, when the signal (output signal $G_{k+1}$ of the next stage or end pulse) is input to the second input terminal IN2, the state returns to the original reset state.

Figure 4:
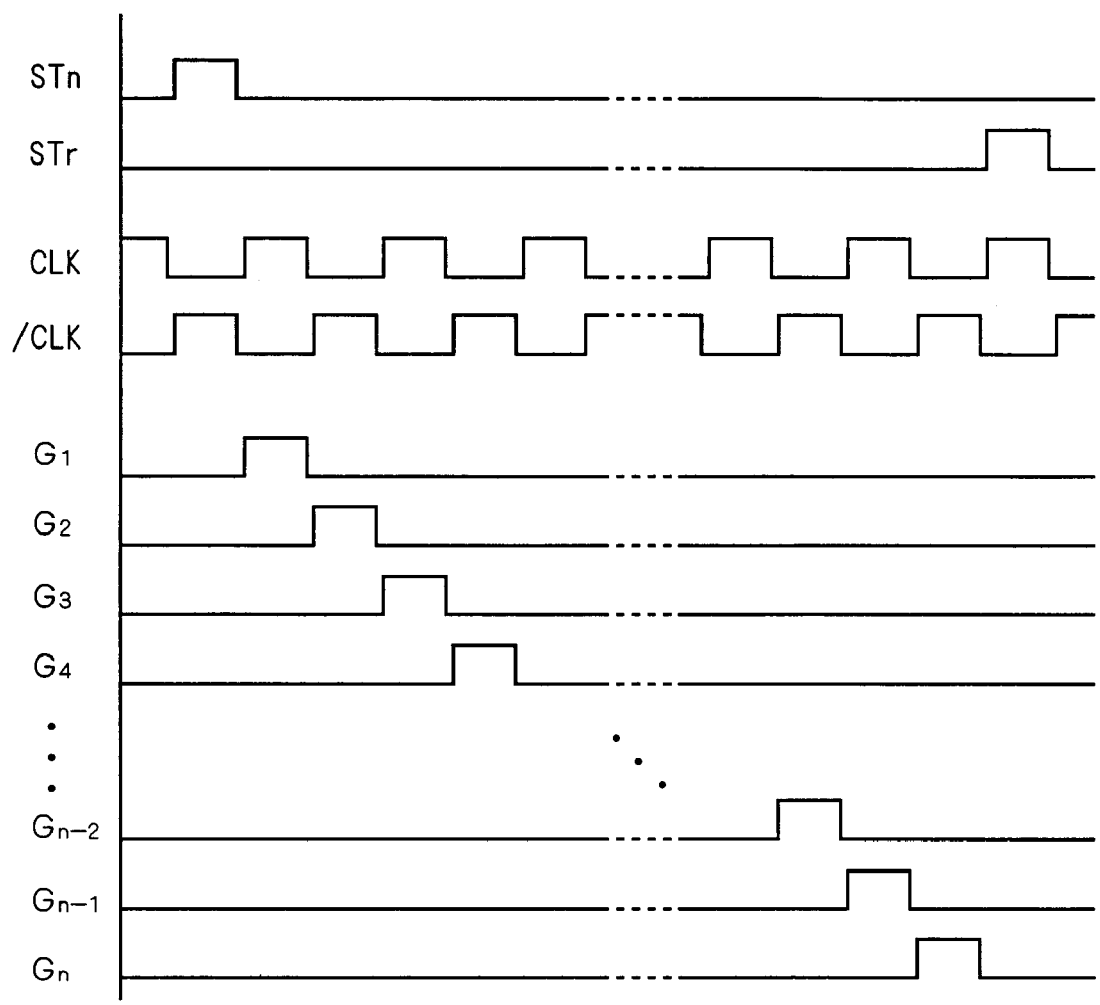
FIG. 4 is a timing chart showing the operation of the gate line driving circuit.

If the plurality of unit shift registers SR operating in this manner are cascade connected as in FIG. 2 to configure the gate line driving circuit 30, the first control pulse STn serving as the start pulse input to the first input terminal IN1 of the unit shift register $SR_1$ of the first stage is transmitted in the order of unit shift register $SR_2$, $SR_3$, . . . while being shifted at a timing synchronized with the clock signals CLK, /CLK as shown in the timing chart of FIG. 4. The gate line driving circuit 30 thereby drives the gate lines $GL_1$, $GL_2$, $GL_3$, . . . in this order at a predetermined scanning period.

In the forward shift, the second control pulse STr serving as the end pulse must be input to the second input terminal IN2 of the relevant unit shift register $SR_n$ immediately after the unit shift register $SR_n$ of the final stage outputs the output signal Gn, as shown in FIG. 4. The relevant unit shift register $SR_n$ is thereby returned to the set state.

On the other hand, when the gate line driving circuit 30 performs the operation of the reverse shift, the voltage signal generator 32 turns the first voltage signal Vn to L level (VSS) and the second voltage signal Vr to H level (VDD). That is, the transistor Q3 functions as the transistor for discharging (pulling down) the node N1 and the transistor Q4 functions as the transistor for charging (pulling up) the node N1 in the reverse shift, in contradiction to the forward shift. The second control pulse STr is input to the second input terminal IN2 of the unit shift register $SR_n$ of the final stage as start pulse, and the first control pulse STn is input to the first input terminal IN1 of the unit shift register $SR_1$ of the first stage as the end pulse. Therefore, the operation of the transistor Q3 and the transistor Q4 is interchanged with each other with respect to the forward shift in the unit shift register SR of each stage.

Therefore, in the reverse shift, the unit shift register SR maintains the reset state while the signal (start pulse or output signal $G_{k+1}$ of the next stage) is not input to the second input terminal IN2. Since the transistor Q1 is turned OFF and the transistor Q2 is turned ON in the reset state, the output terminal OUT (gate line $GL_k$) is maintained at L level (VSS) of low impedance. When the signal is input to the second input terminal IN2, the unit shift register SR switches to the set state. Since the transistor Q1 is turned ON and the transistor Q2 is turned OFF in the set state, the output terminal OUT becomes H level and the output signal $G_k$ is output during the period the signal (clock signal CLK) of the clock terminal CK is at H level. Thereafter, when the signal (output signal $G_{k-1}$ of the previous stage or end pulse) is input to the first input terminal IN1, the state returns to the original reset state.

Figure 5:
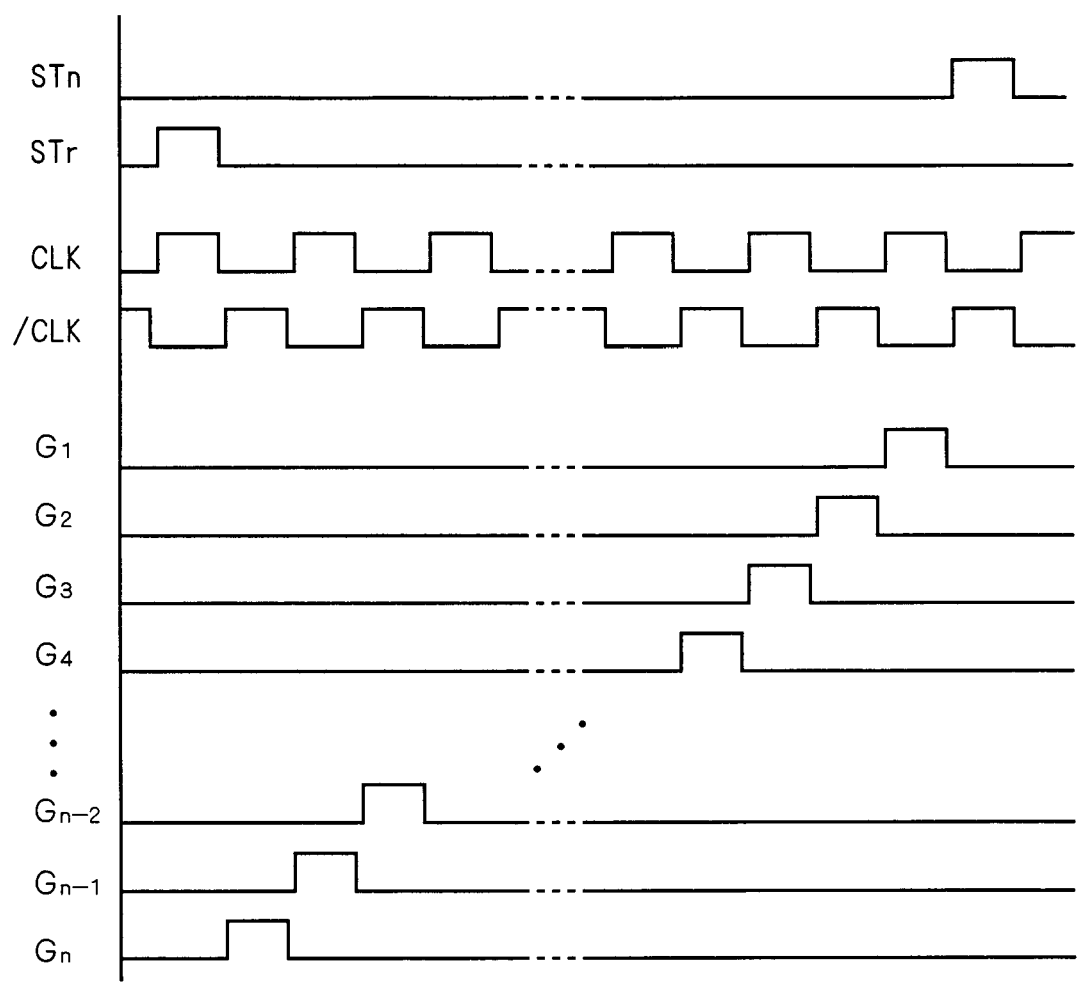
FIG. 5 is a block diagram showing a configuration example of the gate line driving circuit using the bi-directional unit shift register.

If the plurality of unit shift registers SR operating in this manner are cascade connected as in FIG. 2 to configure the gate line driving circuit 30, the second control pulse STr serving as the start pulse input to the second input terminal IN2 of the unit shift register $SR_n$ of the final stage ($n^{th}$ stage) is transmitted in the order of unit shift register $SR_{n-1}$, $SR_{n-2}$, while being shifted at a timing synchronized with the clock signals CLK, /CLK as shown in the timing chart of FIG. 5. The gate line driving circuit 30 thereby drives the gate lines $GL_n$, $GL_{n-1}$, $GL_{n-2}$ in this order, that is, the order opposite the forward shift, at a predetermined scanning period.

In the reverse shift, the first control pulse STn serving as the end pulse must be input to the first input terminal IN1 of the relevant unit shift register $SR_1$ immediately after the unit shift register $SR_1$ of the first stage outputs the output signal $G_1$, as shown in FIG. 5. The relevant unit shift register SR1 is thereby returned to the set state.

An example in which a plurality of unit shift registers SR operate based on two phase clocks has been described in the above example, but may be operated using three phase clock signals. In this case, the gate line driving circuit 30 may be configured as shown in FIG. 6.

The clock generator 31 in this case outputs clock signals CLK1, CLK2, and CLK 3, which are three phase clocks having different phases. One of the clock signals CLK1, CLK2, and CLK 3 is input to the clock terminal CK of each unit shift register SR so that clock signals different to each other are input to unit shift registers SR adjacent before and after. The order of becoming H level can be changed within the clock signals CLK1, CLK2, and CLK 3 according to the direction of shifting the signal by program or change of connection of the wiring. For example, the signals become H level in the order of CLK1, CLK2, CLK3, CLK1, in the forward shift, and become H level in the order of CLK3, CLK2, CLK1, CLK3, in the reverse shift.

Figure 6:
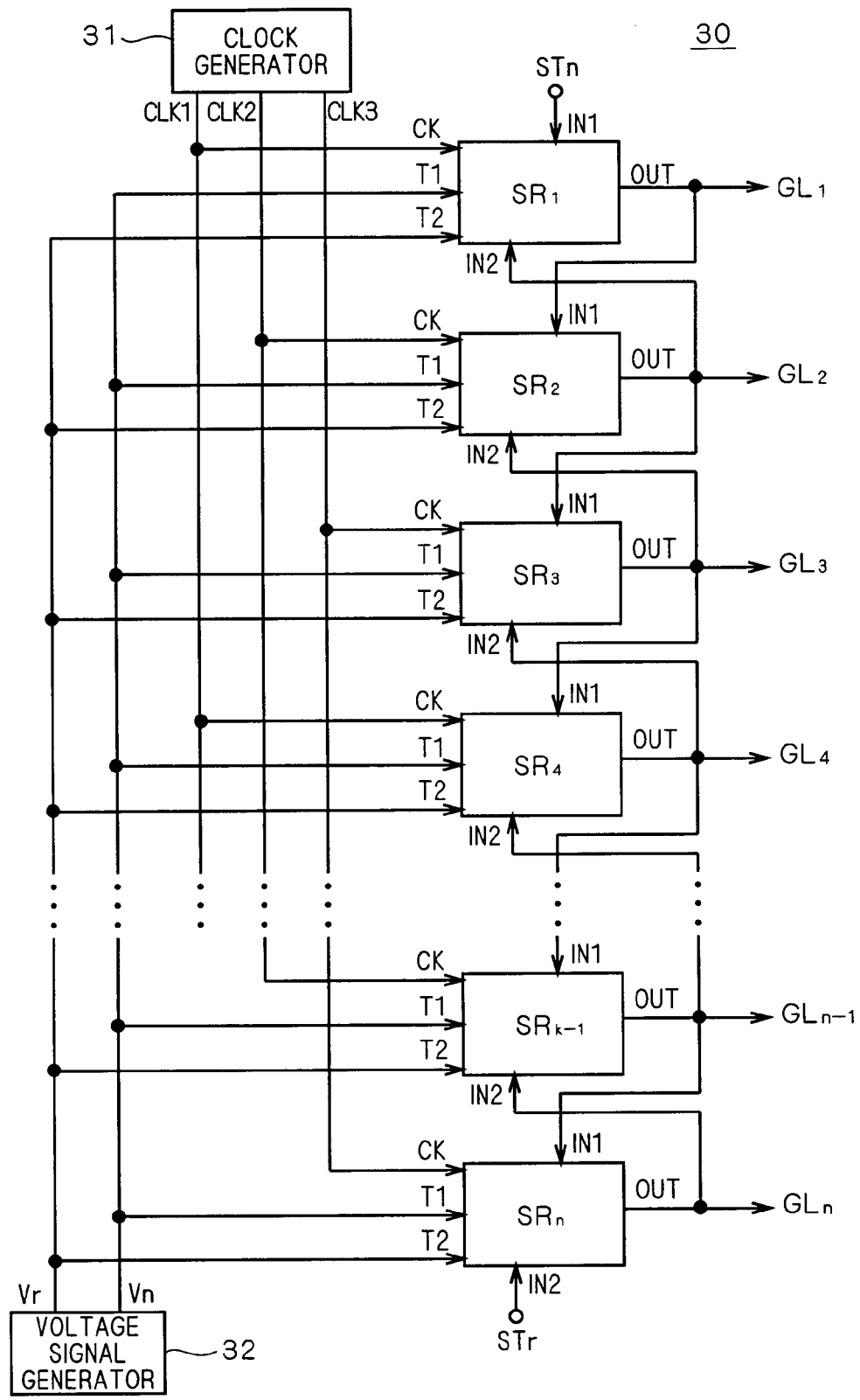
FIG. 6 is a timing chart showing the operation of the gate line driving circuit.

The operation of the individual unit shift register SR is the same for the gate line driving circuit 30 configured as in FIG. 6 as in the case of FIG. 2 described above, and thus the description thereof will be omitted.

In the gate line driving circuit 30 configured as in FIGS. 2 and 6, each unit shift register SR cannot be in the reset state (i.e., initial state) unless after the unit shift register SR of the next stage has operated at least once in the forward shift, for example. In the reverse shift, on the other hand, each unit shift register SR cannot be in the reset state unless after the unit shift register SR of the previous stage has operated at least once. Each unit shift register SR cannot perform the normal operation unless after the reset state. Therefore, the dummy operation of transmitting a dummy input signal from the first stage to the final stage (or from final stage to first stage) of the unit shift register SR must be performed, prior to the normal operation. Alternatively, a reset transistor may be separately arranged between the node N2 and the second power supply terminal S2 (high potential side power supply) of each unit shift register SR, and the reset operation of forcibly charging the node N2 may be performed before the normal operation. In this case, however, the reset signal line must be separately arranged.

The bi-directional shift register according to the present invention will now be described. FIG. 7 is a circuit diagram showing the configuration of the bi-directional unit shift register SR according to the first embodiment. As shown in the figure, the output stage of the relevant unit shift register SR is also configured by the transistor Q1 connected between the output terminal OUT and the clock terminal CK, and the transistor Q2 connected between the output terminal OUT and the first power supply terminal S1. That is, the transistor Q1 is a first transistor for providing the clock signal input to the clock terminal CK to the output terminal OUT, and the transistor Q2 is a second transistor for discharging the output terminal OUT. The node (first node) connected with the gate (control electrode) of the transistor Q1 is defined as node N1, and the node (second node) connected with the gate of the transistor Q2 is defined as node N2.

The transistor Q3, which gate is connected to the first input terminal IN1, is connected between the node N1 and the first voltage signal terminal T1, and the transistor Q4, which gate is connected to the second input terminal IN2, is connected between the node N1 and the second voltage signal terminal T2. That is, the transistor Q3 is a third transistor for providing the first voltage signal Vn to the node N1 based on the signal (first input signal) input to the first input terminal IN1. The transistor Q4 is the fourth transistor for providing the second voltage signal Vr to the node N1 based on the signal (second input signal) input to the second input terminal IN2.

A diode connected transistor Q6 is connected between the node N2 and the second power supply terminal S2 and a transistor Q7, which gate is connected to the node N1, is connected between the node N2 and the first power supply terminal S1. The transistor Q7 has the driving ability (ability to flow current) set sufficiently higher than the transistor Q6, and the transistors Q6, Q7 configure the ratio type inverters having the node N1 as the input end and the node N2 as the output end.

The above configuration is similar to the circuit of FIG. 3, but the bi-directional unit shift register SR according to the present embodiment further includes a transistor Q5, which gate is connected to the node N1, connected between the node N1 and the second voltage signal terminal T2.

Figure 8:
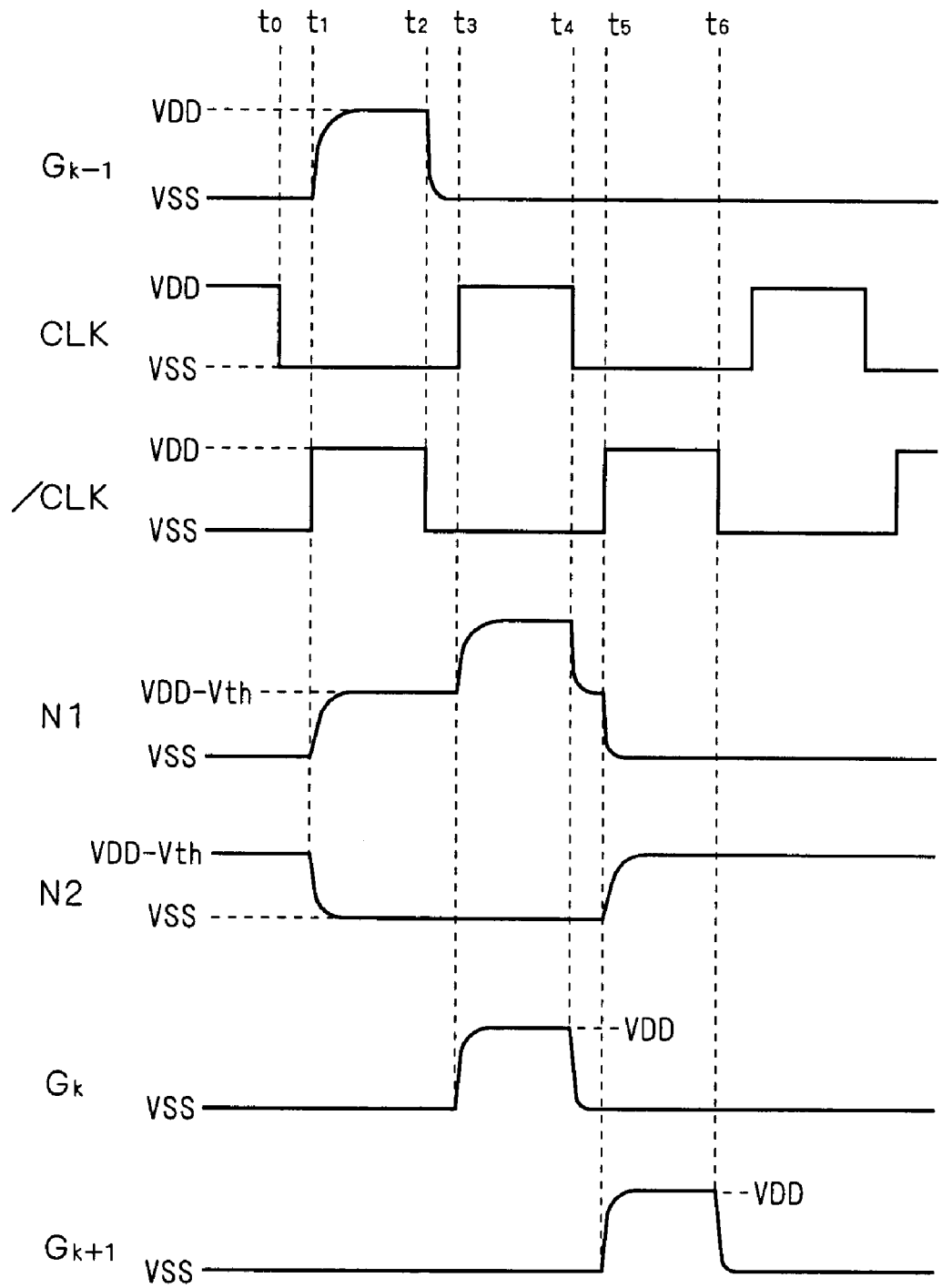
FIG. 8 is a timing chart showing the operation of the bi-directional unit shift register according to the first embodiment.

The operation of the bi-directional shift register SR of FIG. 7 will now be described. The operation is substantially the same as that of FIG. 3, but the timing chart of FIG. 8 will be used to specifically demonstrate the effect of the present invention.

The operation of the unit shift register $SR_k$ of the $k^{th}$ stage will be described herein by way of example. The following description is given assuming the clock signal CLK is input to the clock terminal CK of the relevant shift register $SR_k$ of the $k^{th}$ stage for the sake of simplification. Furthermore, the output signal of the relevant unit shift register $SR_k$ is defined as $G_k$, the output signal of the unit shift register $SR_{k-1}$ of the previous stage (k-1 stage) as $G_{k-1}$, and the output signal of the unit shift register $SR_{k+1}$ of the next stage (k+1 stage) as $G_{k+1}$. The potential of H level of the clock signals CLK, /CLK, the first voltage signal Vn, and the second voltage signal Vr is assumed to be equal to the high potential side power supply potential VDD, and the threshold voltage of each transistor configuring the unit shift register SR is assumed to be all the same, where the value thereof is Vth.

A case in which the gate line driving circuit 30 performs the operation of the forward shift will be described first. The voltage signal generator 32 has the first voltage signal Vn at H level (VDD) and the second voltage signal Vr at L level (VSS).

The reset state in which the node N1 is at L level (VSS), and the node N2 at the H level (VDD-Vth) is assumed as the initial state, and the clock terminal CK (clock signal CLK), the first input terminal IN1 (output signal $G_{k-1}$ of previous stage) and the second input terminal IN2 (output signal $G_{k+1}$ of next stage) are all assumed to be at L level. Since the transistor Q1 is turned OFF and the transistor Q2 is turned ON in the reset state, the output terminal OUT (output signal $G_k$) is maintained at L level irrespective of the level of the clock terminal CK (clock signal CLK).

The clock signal CLK becomes L level at time $t_0$ from the above state, and thereafter, the clock signal /CLK becomes H level and the output signal $G_{k-1}$ (first control pulse STn serving as start pulse for the first stage) of the unit shift register $SR_{k-1}$ of the previous stage becomes H level at time $t_1$, it is input to the first input terminal IN1 of the relevant unit shift register circuit $SR_k$, and the transistor Q3 is turned ON. Although the node N2 is at H level immediately before time $t_1$, and the transistor Q5 is turned ON, since the transistor Q3 is set to have a driving ability sufficiently higher than the transistor Q5, the on-resistance of the transistor Q3 becomes sufficiently lower than the on-resistance of the transistor Q5, and the level of the node N1 rises.

The transistor Q7 thereby starts to become electrically conductive, and the level of the node N2 lowers. The resistance of the transistor Q5 then increases, the level of the node N1 rapidly rises, and the transistor Q7 is sufficiently turned ON. As a result, the node N2 becomes L level (VSS), the transistor Q5 is turned OFF, and the node N1 becomes H level (VDD-Vth). That is, the state of the relevant unit shift register SRk becomes the set state.

Subsequently, the clock signal /CLK becomes L level at time $t_2$, at which point the output signal $G_{k-1}$ of the previous stage returns to L level. The transistor Q3 is then turned OFF, but the set state is maintained since the node N1 becomes H level of floating state.

When the clock signal CLK becomes H level at time $t_3$, the level of the output terminal OUT rises following thereto since the transistor Q1 is turned ON and the transistor Q2 is turned OFF in the set state. The level of the node N1 in the floating state is boosted by a specific voltage due to coupling via gate-channel capacity of the transistor Q1. The driving ability of the transistor Q1 thereby increases, and the level of the output signal Gk changes following the level of the clock terminal CK. Therefore, the output signal $G_k$ is at H level (VDD), and the gate line $GL_k$ is activated and in the selected state during the period the clock signal CLK is at H level.

When the clock signal CLK returns to L level at time $t_4$, the output signal $G_k$ also becomes L level following thereto, whereby the gate line $GL_k$ is discharged and returned to the non-selected state.

The output signal Gk is input to the first input terminal IN1 of the next stage, and thus the output signal $G_{k+1}$ of the next stage becomes H level at time $t_5$ at when the clock signal /CLK becomes H level. The transistor Q4 of the unit shift register $SR_k$ is then turned ON and the node N1 become L level, and the transistor Q7 accordingly is turned OFF and the node N2 becomes H level. That is, the state returns to the reset state in which the transistor Q1 is turned OFF and the transistor Q2 is turned ON. In this case, the transistor Q5 is turned ON in the unit shift register $SR_k$ according to the present embodiment.

When the output signal $G_{k+1}$ of the next stage returns to L level at time $t_6$, the transistor Q4 is turned OFF but the transistor Q5 is maintained in the ON state since the node N2 continues to be at H level, and the node N1 is maintained at L level at low impedance. This state continues until the signal is input to the first input terminal IN1, and the unit shift register $SR_k$ is maintained at the reset state.

As described above, the node N1 is at L level in the floating state after the transistor Q4 is turned OFF, and thus when leakage current is generated at the transistor Q3, the charges involved therewith are accumulated at the node N1, and the potential of the node N1 gradually rises in the conventional circuit shown in FIG. 3. The potential of the node N1 rises while the clock signal CLK is at H level due to coupling via overlapping capacity between the drain and the gate of the transistor Q1. Thus, in the conventional circuit, the gate-source voltage of the transistor Q1 might exceed the threshold voltage due to the potential rise of the node N1 involved in the leakage current and the potential rise of the node N1 of when the clock signal CLK becomes H level. The malfunction problem arises in that the transistor Q1 that is to be turned OFF is turned ON and the gate line is unnecessarily activated (first problem).

This problem does not arise in the unit shift register SR of FIG. 7 since the transistor Q5 is turned ON during the reset state in which the node N1 is at L level, and the node N1 is maintained at the level of VDD at low impedance. Therefore, the pixel switch element (active transistor) arranged on each pixel is prevented from being unnecessarily turned ON, thereby suppressing production of display failure in the display apparatus.

In the case the gate line driving circuit 30 performs the operation of the reverse shift, on the other hand, the voltage signal generator 32 has the first voltage signal Vn at L level (VSS) and the second voltage signal Vr at H level (VDD). The second control pulse STr is input to the second input terminal IN2 of the unit shift register $SR_n$ of the final stage as the start pulse, and the first control pulse $ST_n$ is input to the first input terminal IN1 of the unit shift register $SR_1$ of the first stage as the end pulse. The operations of the transistor Q3 and the transistor Q4 thereby interchange with each other in each unit shift register SR in contradiction to the forward shift, and the reverse shift becomes possible.

The basic operation of the unit shift register SR is the same as in the forward shift even if the operations of the transistor Q3 and the transistor Q4 are interchanged, and the transistor Q5 also functions similar to the forward shift. Therefore, effects similar to the forward shift are obtained even if the unit shift register SR of FIG. 7 performs the operation of the reverse shift.

An example in which the gate line driving circuit 30 is configured as in FIG. 2 by the bi-directional unit shift register SR, and is driven by the two phase clock signals has been described in the above description, but the application of the present invention is not limited thereto. For example, the present invention is also applicable to when the gate line driving circuit 30 is configured as in FIG. 6, and is driven by three phase clock signals.

Second Embodiment

FIG. 9 is a circuit diagram of a bi-directional unit shift register SR according to the second embodiment. As shown in the figure, the unit shift register SR according to the present embodiment has a configuration in which a transistor Q12 and a transistor Q13 having a relatively large driving ability are additionally arranged with respect to the conventional circuit of FIG. 3.

The transistor Q12 is connected between the node N2 and the first voltage signal terminal T1, and the gate is connected to the second input terminal IN2. That is, the transistor Q12 functions to provide the first voltage signal Vn to the node N2 (second node) based on the signal (second input signal) input to the second input terminal IN2. The transistor Q13 is connected between the node N2 and the second voltage signal terminal T2, and the gate is connected to the first input terminal IN1. That is, the transistor Q13 functions to provide the second voltage signal Vr to the node N2 based on the signal (first input signal) input to the first input terminal IN1.

The operation of the unit shift register SR of FIG. 9 is basically similar to the conventional circuit of FIG. 3 but differs in the following aspects. The unit shift register $SR_k$ of the $k^{th}$ stage will be described herein by way of example.

Assume the operation of the forward shift. The first voltage signal Vn is at H level and the second voltage signal Vr is at L level. In the conventional circuit of FIG. 3, when the output signal $G_{k-1}$ of the previous stage (first control pulse STn serving as start pulse for the first stage) is input to the first input terminal IN1, the transistor Q3 is turned ON and the node N1 becomes H level, and the transistor Q7 is accordingly turned ON and the node N2 becomes L level. In the unit shift register $SR_k$ of FIG. 9, the transistor Q13 having a large driving ability is turned ON with the operation of the unit shift register $SR_k$, and thus the node N2 becomes L level (VSS) at high speed.

In the conventional circuit of FIG. 3, when the output signal $G_{k+1}$ of the next stage (second control pulse STr serving as end pulse for the final stage) is input to the second input terminal IN2, the transistor Q4 is turned ON and the node N1 becomes L level, and the transistor Q7 is accordingly turned OFF, and the node N2 becomes H level. In the unit shift register $SR_k$ of FIG. 9, the transistor Q12 having a large driving ability is turned ON with the operation of the unit shift register SRk, and thus the node N2 becomes H level (VDD-Vth) at high speed.

Assume the operation of the reverse shift. The first voltage signal Vn is at L level and the second voltage signal Vr is at H level. Therefore, in the unit shift register $SR_k$ of FIG. 9, when the output signal $G_{k+1}$ of the next stage is input to the second input terminal IN2, the transistor Q12 is turned ON, and the node N2 becomes L level (VSS) at high speed. When the output signal $G_{k-1}$ of the previous stage is input to the first input terminal IN1, the transistor Q13 is turned ON, and the node N2 becomes H level (VDD-Vth) at high speed.

According to the present embodiment, the rise and fall of the level of the node N2 becomes faster due to the action of the transistors Q12, Q13. In particular, when the unit shift register SR transitions from the selective period to the non-selective period, the transistor Q2 is turned ON at high speed and sufficiently as the level of the node N2 rapidly becomes H level, whereby the influence of the noise added to the output terminal OUT via the gate line is suppressed, and malfunction caused by noise is resolved (fourth problem).

In the conventional circuit of FIG. 3, the node N2 rapidly becomes H level by increasing the size and increasing the driving ability of the transistor Q6, thereby suppressing the problem of malfunction caused by noise. However, since the transistors Q6, Q7 configure the ratio type inverter, if the size of the transistor Q6 is large, the pass through current flowing through the relevant inverter becomes large when the transistor Q7 is turned ON and the node N2 becomes L level (correspond to time $t_1$ to $t_5$ in FIG. 8), thereby increasing the power consumption.

In the unit shift register SR of FIG. 9, on the other hand, the node N2 rapidly becomes H level without increasing the size of the transistor Q6, and thus does not involve increase in power consumption. The larger the driving ability of the transistors Q12, Q13, the more the effect of having the node N2 to H level at high speed enhances. However, the increase in power consumption barely occurs since the transistors Q12, Q13 are not simultaneously turned ON and do not form a passage for the pass through current.

The driving ability of the transistor Q6 in the present embodiment only needs to be the driving ability of an extent of maintaining the node N2 at H level after the node N2 becomes H level, that is, an extent of at least compensating for the leakage current generated at the node N2. That is, advantages of having the driving ability of the transistor Q6 smaller than the prior art, and reducing the pass through current generated at the inverter comprising transistors Q6, Q7 are also obtained.

Third Embodiment

Figure 10:
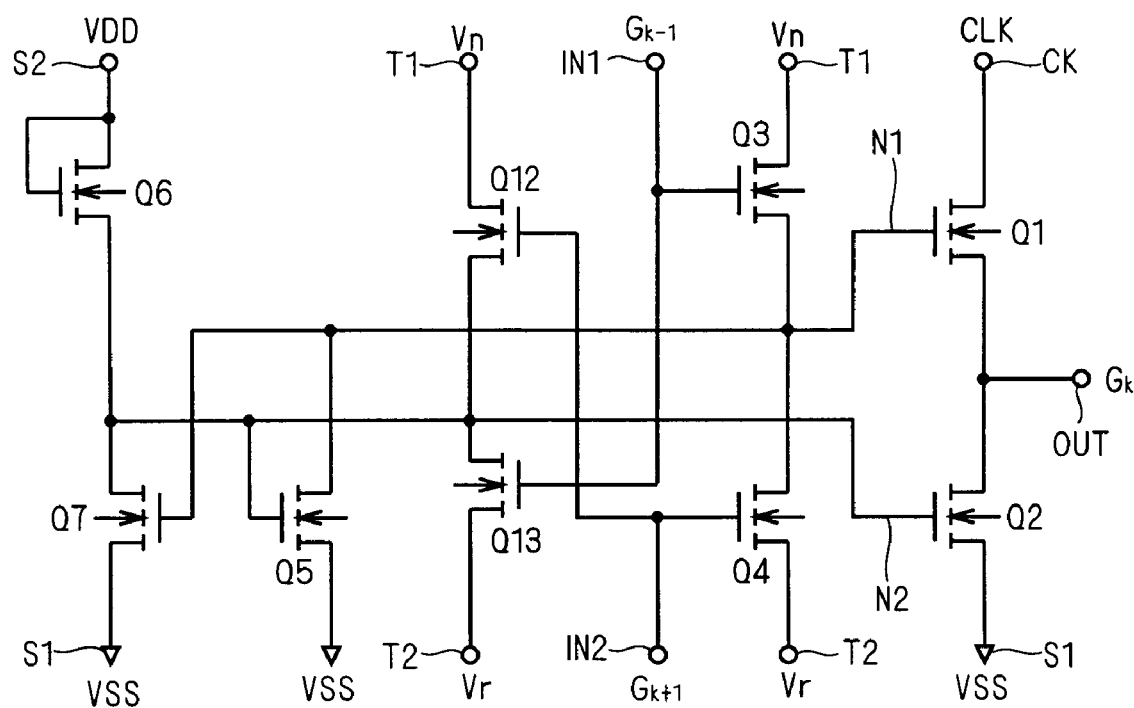
FIG. 10 is a circuit diagram of a bi-directional unit shift register according to a third embodiment.

FIG. 10 is a circuit diagram showing a configuration of a bi-directional unit shift register according to the third embodiment. As shown in the figure, the unit shift register SR according to the third embodiment has a configuration in which the transistor Q12 and the transistor Q13 having a relatively large driving ability shown in the second embodiment are additionally arranged with respect to the unit shift register SR (FIG. 7) of the first embodiment.

The circuit of FIG. 7 as described in the first embodiment operates to change the node N1 from L level to H level when the output signal $G_{k-1}$ of the previous stage is input to the first input terminal IN1 (time $t_1$ in FIG. 8) in the operation of the forward shift, for example. However, such operation is performed from a state in which the transistor Q5 is turned ON, and thus the level of the node N1 is unlikely to rise. Therefore, the rising speed of the level of the node N1 may be slow, which inhibits the operation from being performed at high speed.

On the other hand, in the unit shift register SR according to the present embodiment, when the output signal $G_{k-1}$ of the previous stage is input to the first input terminal IN1, the transistor Q13 having a large driving ability is turned ON, and thus the node N2 immediately becomes L level and the transistor Q5 is turned OFF. Thus, the level of the node N1 rapidly rises, and the above problem does not arise. That is, according to the present embodiment, effects similar to the first embodiment are obtained by arranging the transistor Q5 in the unit shift register SR, in which case, the rising speed of the level of the node N1 is suppressed from becoming slow.

In the case of reverse shift, the transistor Q12 is turned ON when the output signal $G_{k+1}$ of the next stage is input to the second input terminal IN2, and the node N2 immediately becomes L level, and the transistor Q5 is turned OFF. Therefore, effects similar to the forward shift are obtained.

Fourth Embodiment

FIG. 11 is a circuit diagram of a bi-directional unit shift register SR according to the fourth embodiment. As shown in the figure, the relevant unit shift register SR has a configuration in which transistors Q3A, Q4A, Q8, Q9 are additionally arranged with respect to the conventional circuit of FIG. 3.

As shown in FIG. 11, the transistor Q3 is connected to the first voltage signal terminal T1 by way of the transistor Q3A, and the transistor Q4 is connected to the second voltage signal terminal T2 by way of the transistor Q4A. The gate of the transistor Q3A is connected to the first input terminal IN1 similar to the gate of the transistor Q3, and the gate of the transistor Q4A is connected to the gate of the transistor Q4. The connecting node (third node) between the transistor Q3 and the transistor Q3A is defined as node N3, and the connecting node (fourth node) between the transistor Q4 and the transistor Q4A is defined as node N4.

A diode connected transistor Q8 (unidirectional first switching element) is connected between the output terminal OUT and the node N3 so that the direction from the output terminal OUT to the node N3 becomes the forward direction (direction of flowing current). A diode connected transistor Q9 (unidirectional first switching element) is connected between the output terminal OUT and the node N4 so that the direction from the output terminal OUT to the node N4 becomes the forward direction. The transistor Q8 flows the current from the output terminal OUT to the node N3 and charges the node N3 when the output terminal OUT becomes H level (when activated). Similarly, the transistor Q9 flows current from the output terminal OUT to the node N4 and charges the node N4 when the output terminal OUT becomes H level. That is, the transistors Q8, Q9 function as charging circuits for charging the nodes N3, N4.

Figure 12:
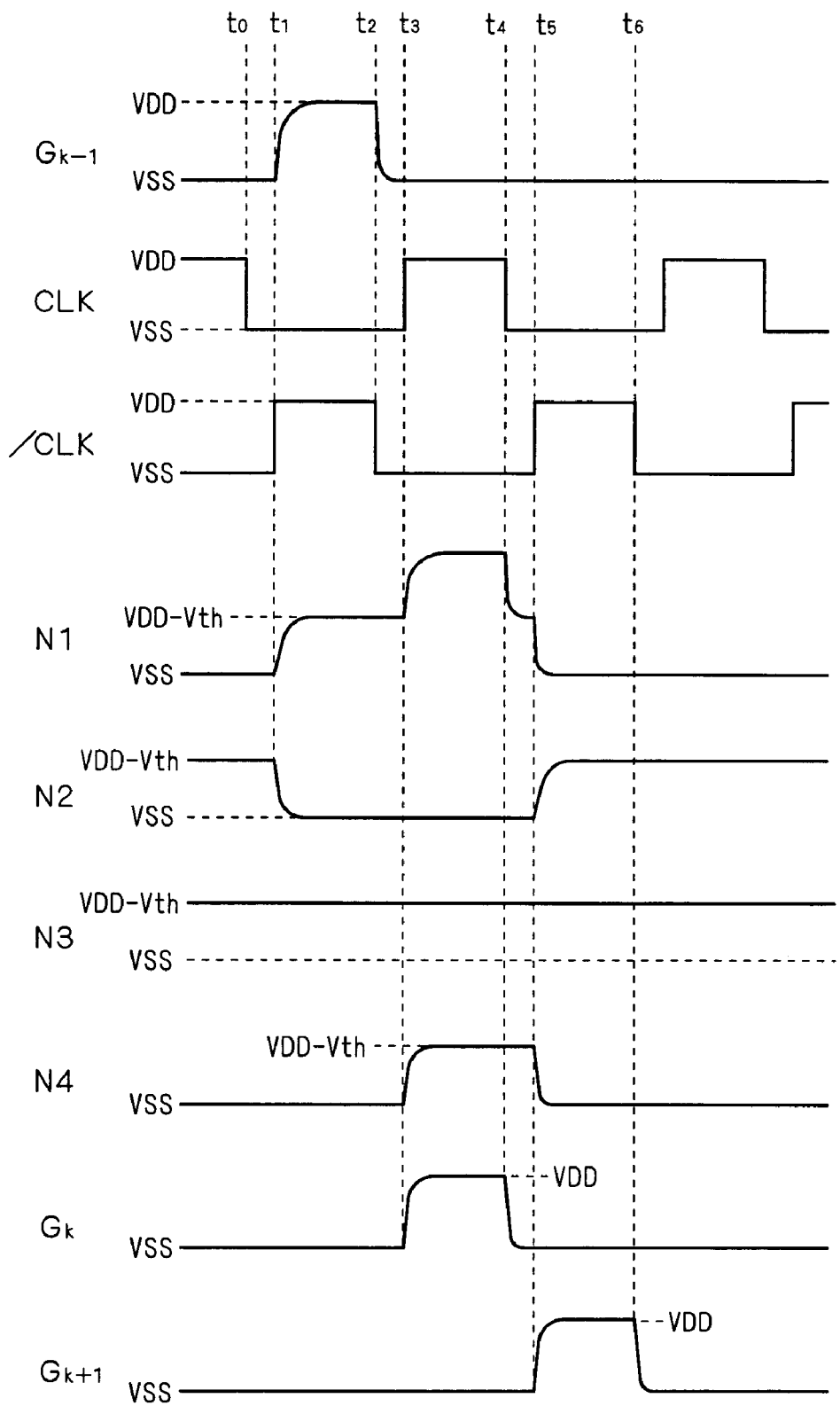
FIG. 12 is a timing chart showing the operation of the bi-directional unit shift register according to the fourth embodiment.

The operation of the bi-directional unit shift register SR of FIG. 11 will now be described. FIG. 12 is a timing chart showing the operation in time of forward shift of the unit shift register SR of FIG. 11.

The operation of the unit shift register $SR_k$ of the $k^{th}$ stage of when the gate line driving circuit 30 performs the operation of the forward shift will be described herein by way of example. That is, the first voltage signal Vn generated by the voltage signal generator 32 is at H level (VDD) and the second voltage signal Vr is at L level (VSS).

The reset state in which the node N1 is at L level (VSS), and the node N2 is at H level (VDD-Vth) is assumed as the initial state, and the clock terminal CK (clock signal CLK), the first input terminal IN1 (output signal $G_{k-1}$ of previous stage) and the second input terminal IN2 (output signal $G_{k+1}$ of next stage) are all assumed to be at L level. Since the transistor Q1 is turned OFF and the transistor Q2 is turned ON in the reset state, the output terminal OUT (output signal $G_k$) is at L level.

The clock signal CLK becomes L level at time to from the above state, and thereafter, the transistors Q3, Q3A are both turned ON when the clock signal /CLK becomes H level, and the output signal $G_{k-1}$ (first control pulse STn serving as start pulse for the first stage) of the unit shift register $SR_{k-1}$ of the previous stage becomes H level at time t1. The node N1 thus becomes H level (VDD-Vth), and the transistor Q7 is accordingly turned ON and the node N2 becomes L level (VSS). That is, the relevant unit shift register $SR_k$ is in the set state. The node N3 is at H level (VDD-Vth) at this point, but the current does not flow from the node N3 to the output terminal OUT since the transistor Q8 functions as the diode having the direction of the output terminal OUT to the node N3 as the forward direction.

Subsequently, the clock signal /CLK becomes L level at time $t_2$, at which point the output signal $G_{k-1}$ of the previous stage returns to L level. The transistors Q3, Q3A are then turned OFF, but the set state is maintained since the node N1 becomes H level of floating state. The node N3 also becomes H level of floating state.

When the clock signal CLK becomes H level at time $t_3$, the level of the output terminal OUT rises following thereto since the transistor Q1 is turned ON and the transistor Q2 is turned OFF in the set state. The level of the node N1 is boosted by a specific voltage. The driving ability of the transistor Q1 thereby increases, and the level of the output signal $G_k$ changes following the level of the clock terminal CK. Therefore, the output signal $G_k$ becomes H level (VDD) during the period the clock signal CLK is at H level.

As described above, when the node N1 is boosted, high voltage is applied between the drain and the source of the transistor Q4, and thus leakage current is generated at the relevant transistor Q4, and the level of the node N1 may lower in the conventional circuit of FIG. 3. The driving ability of the first transistor cannot be sufficiently ensured, and the falling speed of the output signal Gk may become slower (second problem).

On the other hand, the diode connected transistor Q9 is turned ON and the level of the node N4 becomes VDD-Vth when the node N1 is boosted, that is, when the output terminal OUT becomes H level (VDD) in the unit shift register SR of FIG. 11. The transistor Q4 has the gate potential at VSS, and the source potential at VDD-Vth, and the gate is in a state negatively biased with respect to the source. Therefore, the leakage current between the drain and the source of the relevant transistor Q4 is sufficiently suppressed, and the lowering in the level of the node N1 is suppressed.

Therefore, when the clock signal CLK subsequently becomes L level at time $t_4$, the output signal $G_k$ rapidly changes to L level following thereto, whereby the gate line $GL_k$ is discharged at high speed and becomes L level. Therefore, each pixel transistor is rapidly turned OFF, and occurrence of display failure caused by re-writing of data in the pixel to the data of the next line is suppressed.

The output signal $G_{k+1}$ of the next state becomes H level at time $t_5$ at when the clock signal /CLK becomes H level. The transistors Q4, Q4A of the relevant unit shift register $SR_k$ are then turned ON and the node N1 becomes L level, and the transistor Q7 is accordingly turned OFF and the node N2 becomes H level. That is, the state returns to the reset state in which the transistor Q1 is turned OFF and the transistor Q2 is turned ON. The node N4 also becomes L level at this point.

When the output signal $G_{k+1}$ of the next stage returns to L level at time $t_6$, the transistors Q4, Q4A are turned OFF, and thus the node N1 and the node N4 become L level of floating state. This state continues until a signal is input to the first input terminal IN1, and the relevant unit shift register $SR_k$ is maintained in the reset state.

The operation of the reverse shift will now be assumed. In this case, the first voltage signal Vn is at L level and the second voltage signal Vr is at H level, and thus when the node N1 is boosted, high voltage is applied between the drain and the source of the transistor Q3, and thus the leakage current becomes a concern in the conventional circuit of FIG. 3.

When the unit shift register $SR_k$ of FIG. 11 performs the operation of the reverse shift, on the other hand, the current flows to the node N3 via the transistor Q8 when the node N1 is boosted, and the level of the node N3 becomes VDD-Vth. The transistor Q3 has the gate potential at VSS and the source potential at VDD-Vth, and the gate is in a state negatively biased with respect to the source. Therefore, the leakage current between the drain and the source of the transistor Q3 is sufficiently suppressed, and lowering in the level of the node N1 is suppressed. That is, effects similar to the forward shift are obtained.

A configuration in which the transistors Q3A, Q4A, Q8, and Q9 according to the present embodiment are arranged in the conventional circuit of FIG. 3 has been shown in FIG. 11, but the present embodiment is also applicable to the bi-directional unit shift register SR of first to third embodiments (FIGS. 7, 9, 10) and the like.

Fifth Embodiment

In the display apparatus in which the shift register of the gate line driving circuit is configured by an amorphous silicon TFT (a-Si TFT), increasing the area is facilitated and productivity is higher, and thus is widely used in the screen of a laptop PC, large screen display apparatus etc. However, in the a-Si TFT, the threshold voltage shifts when the gate electrode is continuously biased, thereby affecting the driving ability.

The node N3 is continuously at the positive potential (VDD-Vth), as shown in FIG. 12, while the bi-directional unit shift register SR (FIG. 11) of the fourth embodiment is performing the operation of the forward shift. This means that gate-source and gate-drain of the transistor Q3A are negatively biased, which leads to a great shift in the negative direction of the threshold voltage of the transistor Q3A. When the shift to the negative direction of the threshold voltage advances, the transistor substantially becomes a normally ON type, where the current flows between the drain and the source even if the voltage between the gate and the source is 0V. When the transistor Q3 becomes normally ON, the following problems arise when the relevant unit shift register SR subsequently performs the operation of the reverse shift.

That is, in the unit shift register SR of the fourth embodiment, the current for charging the node N3 through the transistor Q8 when the output terminal OUT becomes H level (when node N1 is boosted) in the reverse shift in which the first voltage signal Vn is at L level (VSS). However, since the transistor Q4A is normally ON, the charges due to the current thereof flows out to the first input terminal IN1 through the transistor Q3A, and the power consumption increases. In addition, the effect of the fourth embodiment to suppress the leakage current of the transistor Q3 cannot be obtained since the node N3 cannot be sufficiently charged. The bi-directional unit shift register that solves such problem is thereby proposed in the fifth embodiment.

FIG. 13 is a circuit diagram showing the configuration of the bi-directional unit shift register according to the fifth embodiment. As shown in the figure, a transistor Q10, which gate is connected to the second input terminal IN2, is arranged between the node N3 and the first power supply terminal S1 (VSS), and a transistor Q11, which gate is connected to the first input terminal IN1, is arranged between the node N4 and the first power supply terminal S1 with respect to the unit shift register SR (FIG. 11) of the fourth embodiment. In other words, the transistor Q11 is a transistor for discharging the node N4 (fourth node) based on the signal (first input signal) input to the first input terminal IN1, and the transistor Q10 is a transistor for discharging the node N3 (third node) based on the signal (second input signal) input to the second input terminal IN2.

Figure 14:
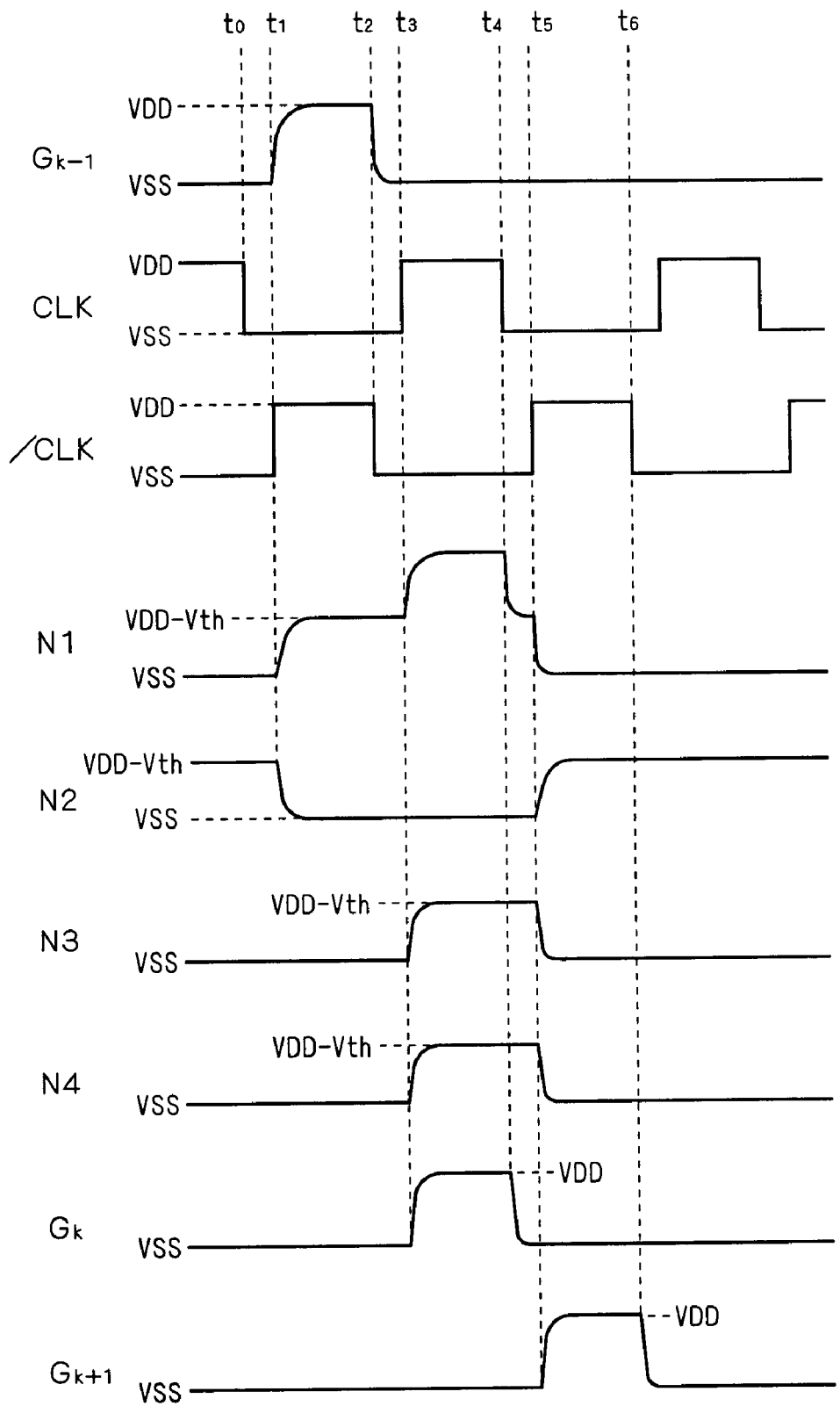
FIG. 14 is a timing chart showing the operation of the bi-directional unit shift register according to the fifth embodiment.

FIG. 14 is as timing chart showing the operation in time of the forward shift of the bi-directional unit shift register according to the fifth embodiment. The relevant operation is substantially the same as that shown in FIG. 12, and thus the detailed description will be omitted, and only the characteristic features of the present embodiment will be described.

In the present embodiment, since the transistor Q10 is turned ON when the output signal $G_{k+1}$ of the next stage becomes H level at time $t_5$, the node N3 is discharged to L level (VSS) at the relevant timing. When the output signal $G_{k+1}$ of the next stage returns to L level at the subsequent time $t_6$, the transistor Q10 is turned OFF, but the node N3 is in the floating state, and the node N3 is maintained at L level until the output signal $G_{k-1}$ of the previous stage becomes H level the next time. That is, the node N3 is charged only for about one horizontal period of time $t_3$ to $t_5$, and the transistor Q3A only has gate-source and gate-drain negatively biased during the relevant period, as shown in FIG. 14. Therefore, the threshold voltage of the transistor Q3A barely shifts, and the above problem is prevented.

In the operation of the reverse shift, the transistor Q11 is turned ON and the node N4 is discharged to L level (VSS) when the output signal $G_{k-1}$ of the previous stage is at H level. As a result, gate-source and gate-drain of the transistor Q4A are prevented from continuously being negatively biased, and the threshold voltage of the transistor Q4 barely shifts. That is, effects similar to the forward shift are obtained.

Sixth Embodiment

Figure 15:
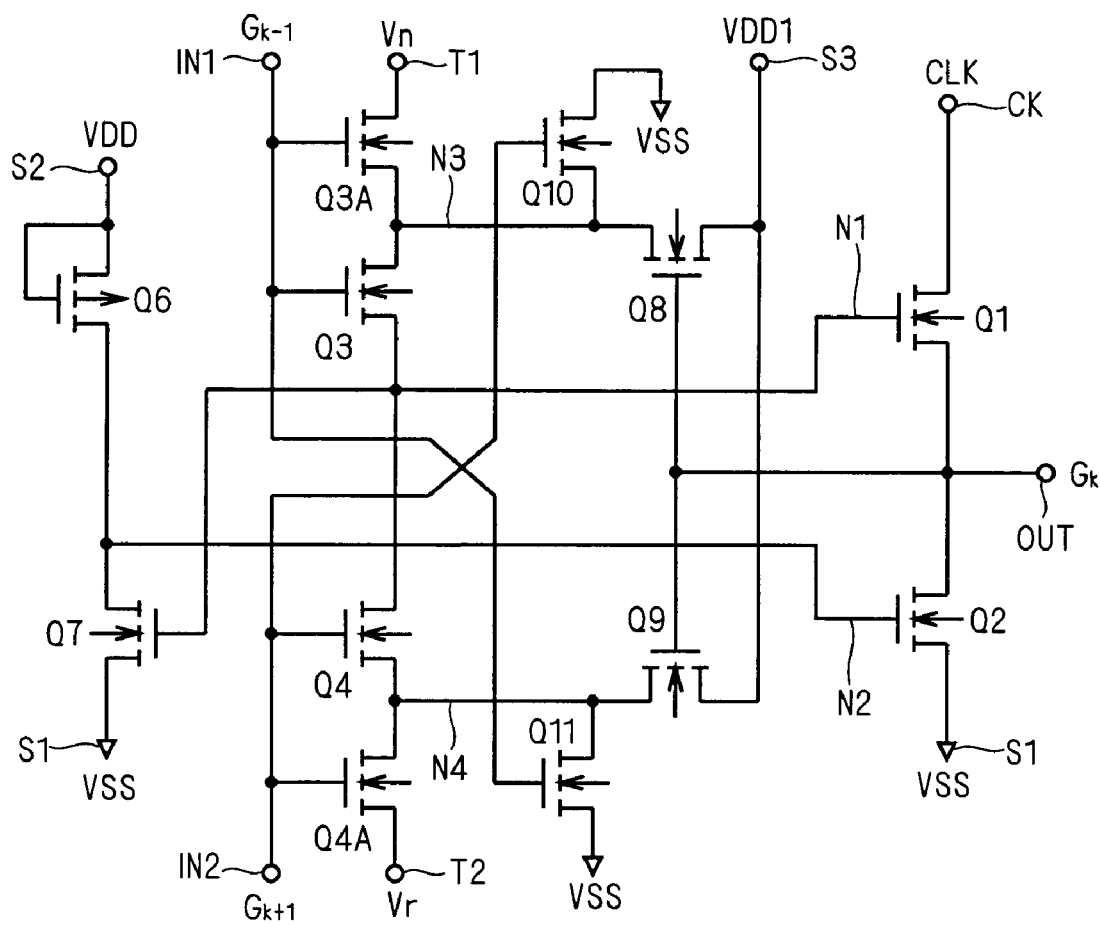
FIG. 15 is a circuit diagram of a bi-directional unit shift register according to a sixth embodiment.

FIG. 15 is a circuit diagram of a bi-directional unit shift register SR according to the sixth embodiment. In the fifth embodiment, the drains of the transistors Q8, Q9 configuring the charging circuits for charging the nodes N3, N4 are connected to the output terminal OUT, and the relevant transistors Q8, Q9 function as diodes. In the present embodiment, however, the drains of the transistors Q8, Q9 are connected to a third power supply terminal S3 to be supplied with a predetermined high potential side power supply potential VDD1.

The operation of the unit shift register SR of FIG. 15 is basically the same as the fifth embodiment, and similar effects are obtained. However, the present embodiment differs from the fifth embodiment in that the supply source of the charges for charging the node N3 and the node N4 is not the output signal that appears at the output terminal OUT, but is the power supply for supplying the high potential side power supply potential VDD1.

According to the present embodiment, the load capacity of the output terminal OUT is alleviated compared to the unit shift register SR of the fifth embodiment, and thus the charging speed of the gate line is increased. Therefore, the operation becomes faster.

The high potential side power supply potential VDD1 supplied to the third power supply terminal S3 may be the same potential as the high potential side power supply potential VDD supplied to the second power supply terminal S2. In this case, the second power supply terminal S2 and the third power supply terminal S3 may be connected to each other to configure one power supply terminal. The present embodiment has been described as a variant of the fifth embodiment, but is also applicable to the unit shift register SR (FIG. 11) of the fourth embodiment.

Seventh Embodiment

Figure 16:
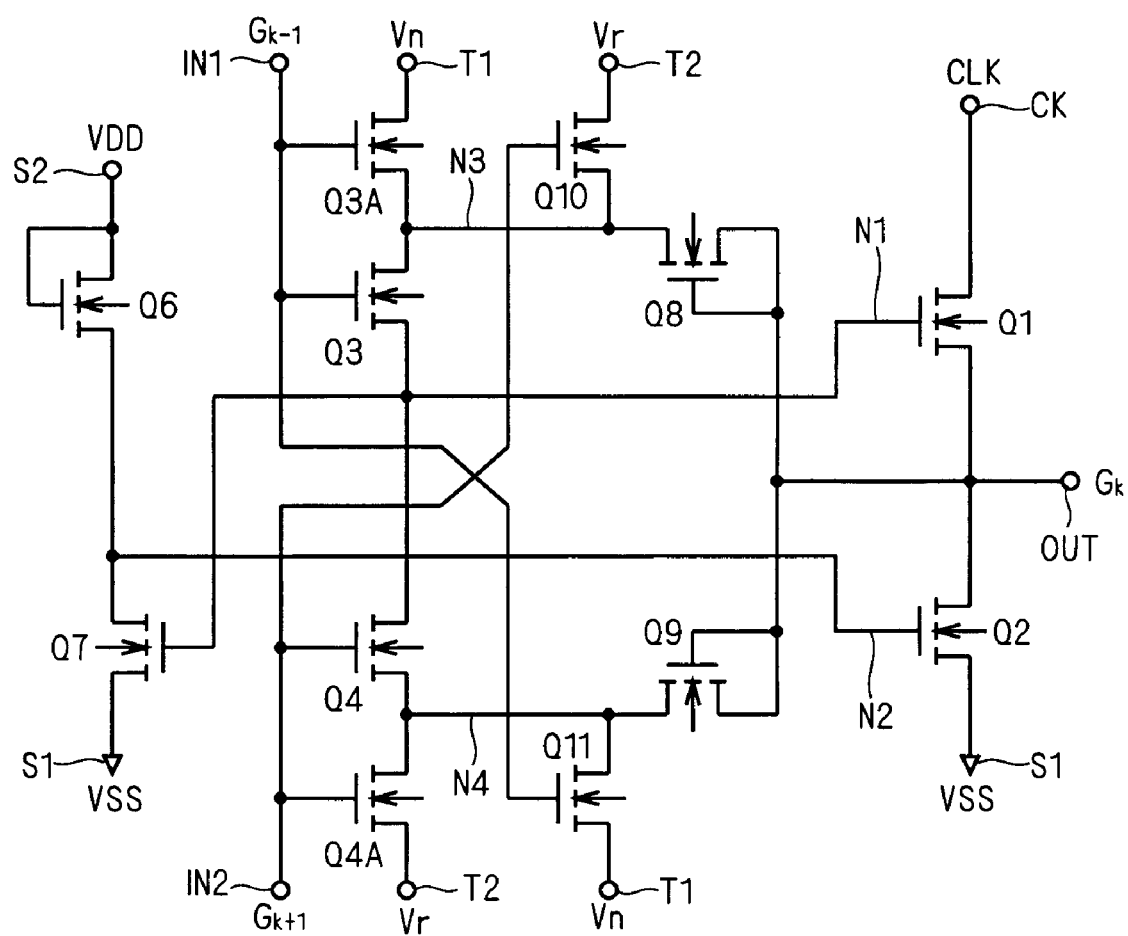
FIG. 16 is a circuit diagram of a bi-directional unit shift register according to a seventh embodiment.

FIG. 16 is a circuit diagram showing a configuration of a bi-directional unit shift register SR according to the seventh embodiment. The sources of the transistors Q10, Q11 are connected to the first power supply terminal S1 supplied with the low potential side power supply potential VSS in the fifth embodiment, but the source of the transistor Q10 may be connected to the second voltage signal terminal T2 supplied with the second voltage signal Vr, and the source of the transistor Q11 may be connected to the first voltage signal terminal T1 supplied with the first voltage signal Vn, as shown in FIG. 16.

The operation of the unit shift register SR of FIG. 16 is basically the same as the fifth embodiment. That is, in the operation of the forward shift, for example, the transistor Q10 discharges the node N3, similar to the fifth embodiment, since the second voltage signal Vr is at L level. In the operation of the reverse shift, the transistor Q11 discharges the node N4, similar to the fifth embodiment, since the first voltage signal Vn is at L level.

Therefore, effects similar to the fifth embodiment are obtained in the present embodiment. In other words, effects of the fifth embodiment are obtained even with the configuration of FIG. 13 or the configuration of FIG. 16, and thus the degree of freedom of the layout of the circuit increases, thereby contributing to reduction in the circuit occupying area.

The present embodiment is also applicable to the unit shift register SR (FIG. 15) of the sixth embodiment.

Eighth Embodiment

The techniques of the first to the seventh embodiments may be combined with respect to each other, and effects corresponding to such combination are obtained. An example of a combination will be described in the present embodiment.

For example, FIG. 17 is a circuit combining the second embodiment (FIG. 9) and the fourth embodiment (FIG. 11). Furthermore, FIG. 18 is a circuit combining the first embodiment (FIG. 7) and the fourth embodiment (FIG. 11). As described above, the fourth embodiment prevents lowering in level of the node N1 caused by leakage current, and thus is also effective in suppressing the leakage current of the transistor Q5 when combining the fourth embodiment and the first embodiment. As shown in FIG. 18, the source of the transistor Q5 is connected to the first power supply terminal S1 (VSS) by way of the transistor Q5A, and the connecting node (node N5) between the transistor Q5 and the transistor Q5A is biased with the output signal Gk. The leakage current of the transistor Q5 is reduced since the gate of the transistor Q5 is negatively biased with respect to the source when boosting the node N1.

A configuration in which the output terminal OUT is connected to the node N5 is described in FIG. 18, but the biasing method of the node N5 is not limited thereto. For example, the technique of the sixth embodiment may be applied, where a transistor Q5B connected between the node N5 and the third power supply terminal S3 supplied with the predetermined high potential side power supply potential VDD1 may be arranged, and the gate thereof may be connected to the output terminal OUT, as shown in FIG. 19. According to such configuration, the node N5 is biased to the potential VDD1 when boosting of the node N1, and effects similar to FIG. 18 are obtained. Furthermore, the load capacity of the output terminal OUT is alleviated compared to the case of FIG. 18, and thus the charging speed of the gate line increases.

Figure 21:
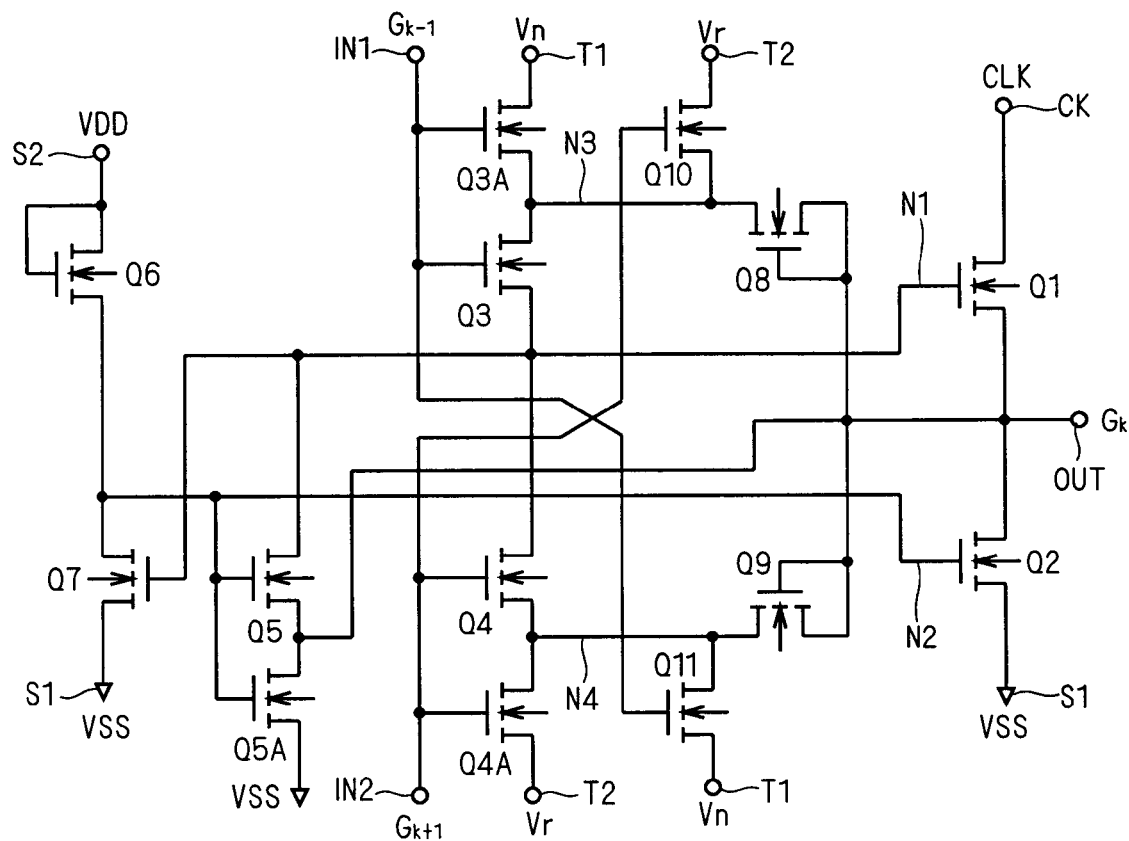
FIG. 21 is a circuit diagram of a bi-directional unit shift register according to the eighth embodiment.

FIG. 20 is a circuit combining the first embodiment (FIG. 7) and the fifth embodiment (FIG. 13), and FIG. 21 is a circuit combining the first embodiment (FIG. 7) and the seventh embodiment (FIG. 16).

Figure 22:
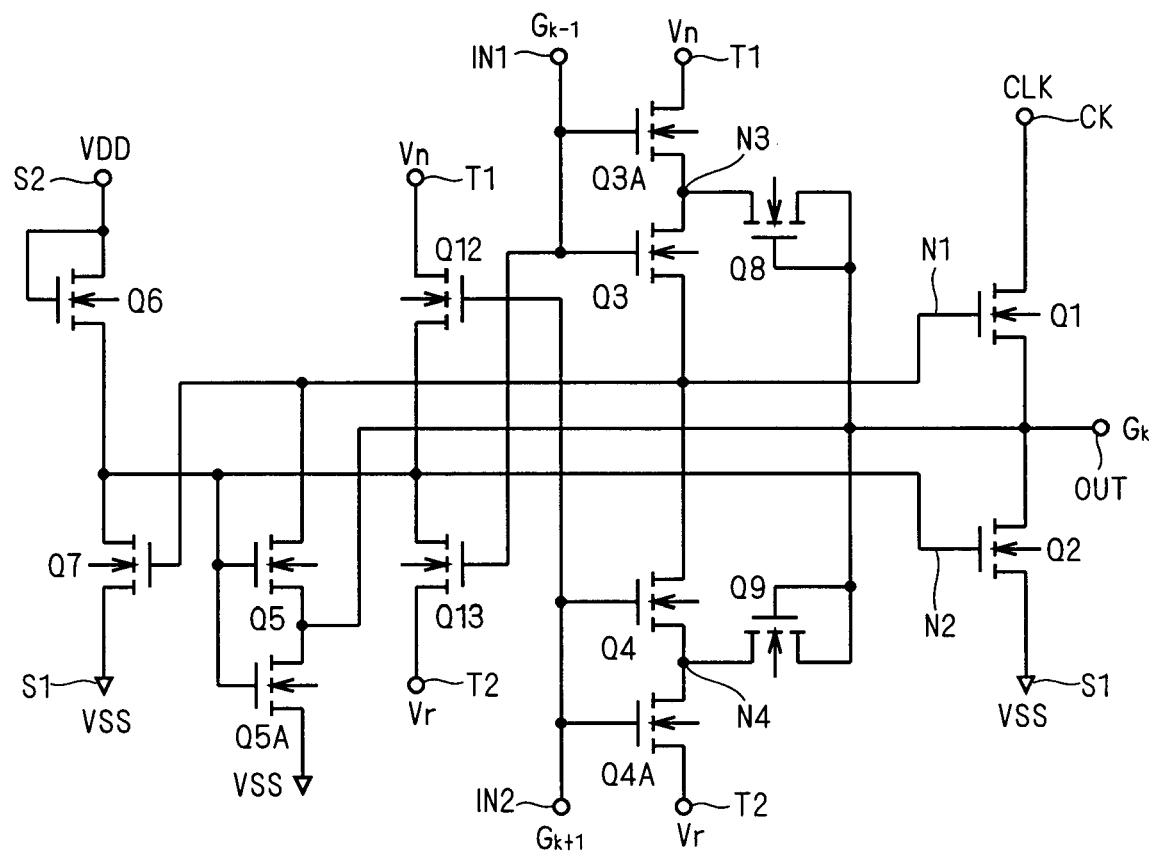
FIG. 22 is a circuit diagram of a bi-directional unit shift register according to the eighth embodiment.

Furthermore, the number of embodiments to be combined is not limited to two, and three or more embodiments may be combined. For example, FIG. 22 is a circuit combining the first embodiment (FIG. 7), the second embodiment (FIG. 9) and the fourth embodiment (FIG. 11), and FIG. 23 is a circuit combining the first embodiment (FIG. 7), the second embodiment (FIG. 9) and the seventh embodiment (FIG. 16).

Only the typical combinations are shown herein, but other combinations are also possible.

Ninth Embodiment

The bi-directional unit shift register SR according to the present invention described above can configure the gate line driving circuit 30 by being cascade connected as in FIG. 2 or FIG. 6. However, in the gate line driving circuit 30 of FIG. 2 and FIG. 6, the first control pulse STn serving as the start pulse must be input to the first input terminal IN1 of the leading stage (unit shift register $SR_1$) as shown in FIG. 4, and thereafter, the second control pulse STr serving as the end pulse must be input to the second input terminal IN2 of the final stage (unit shift register $SR_n$) when performing the forward shift, for example. In performing the reverse shift, the second control pulse STr serving as the start pulse must be input to the second input terminal IN2 of the final stage, as shown in FIG. 5, and thereafter, the first control pulse STn serving as the end pulse must be input to the first input terminal IN1 of the leading stage.

In other words, two types of control pulses of start pulse and end pulse are necessary in the operation of the gate line driving circuit 30 of FIG. 2 and FIG. 6. Thus, the drive controlling device for controlling the operation of the gate line driving circuit 30 that is to be adopted is such mounted with the output circuit of the end pulse in addition to the output circuit of the start pulse, which increases the cost (third problem). Thus, the bi-directional shift register operable only with the start pulse is proposed in the ninth embodiment.

Figure 24:
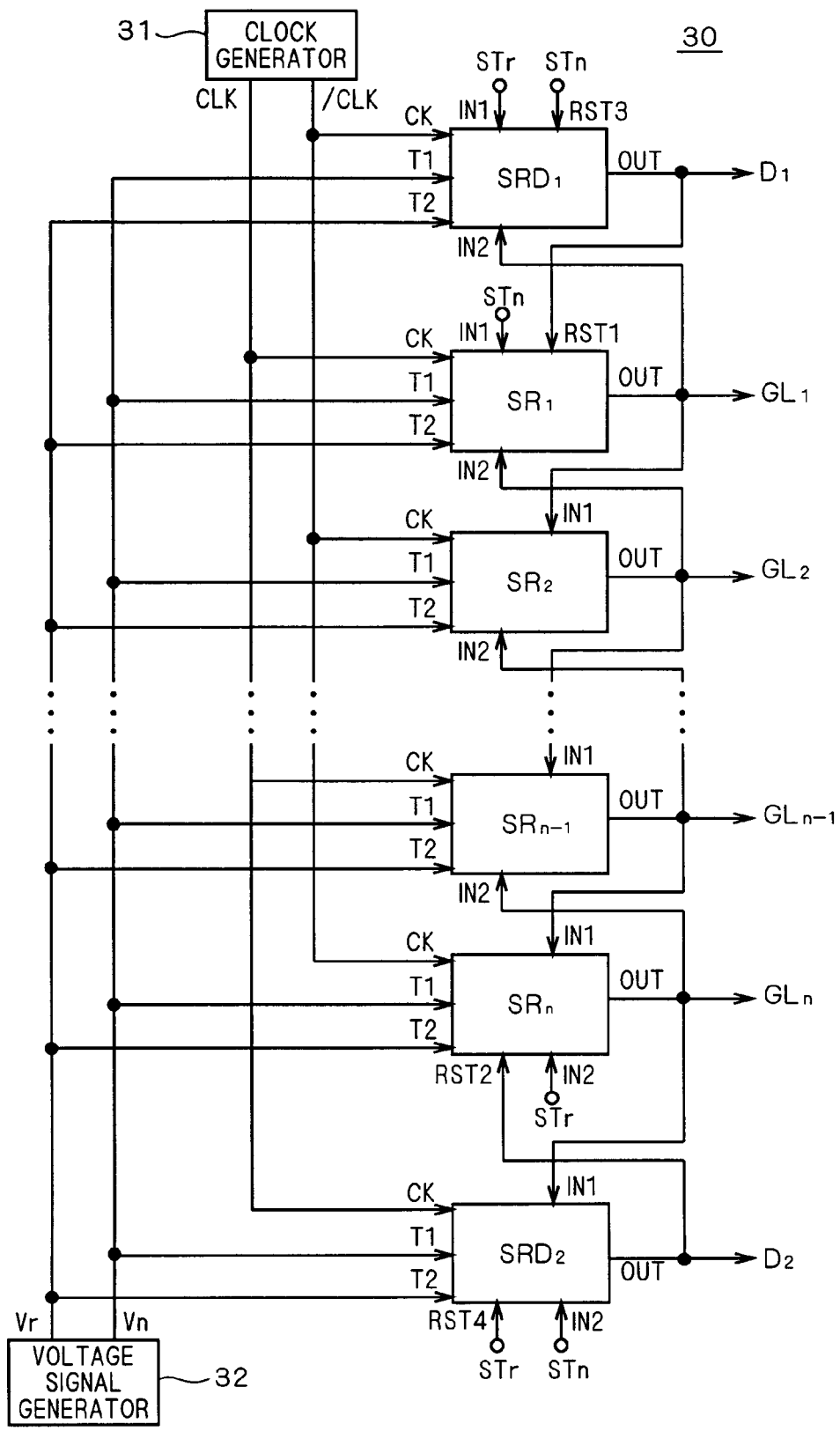
FIG. 24 is a block diagram showing a configuration example of the gate line driving circuit using the bi-directional unit shift register according to a ninth embodiment.
Figure 25:
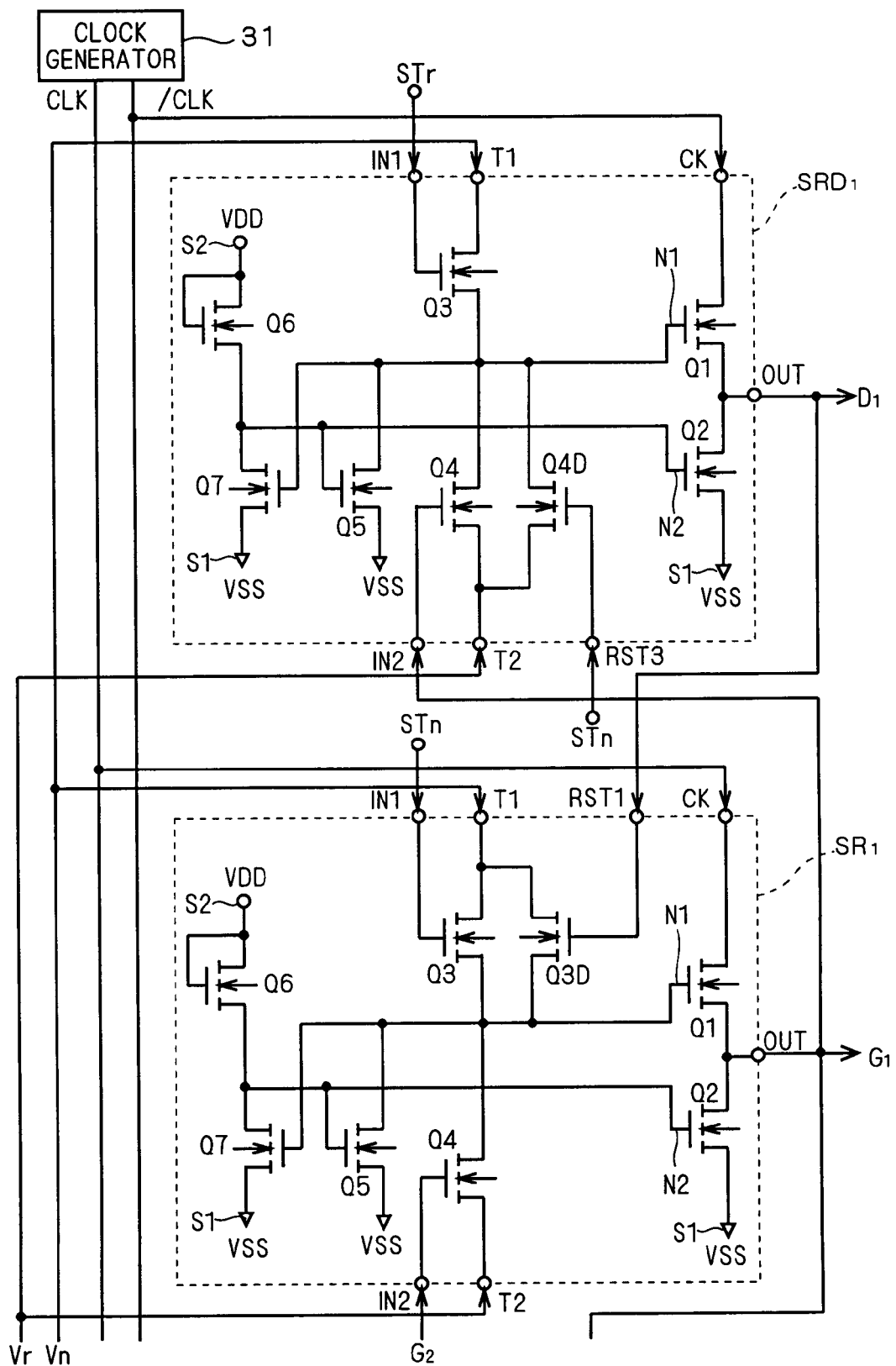
FIG. 25 is a circuit diagram showing a configuration example of the gate line driving circuit according to the ninth embodiment.
Figure 26:
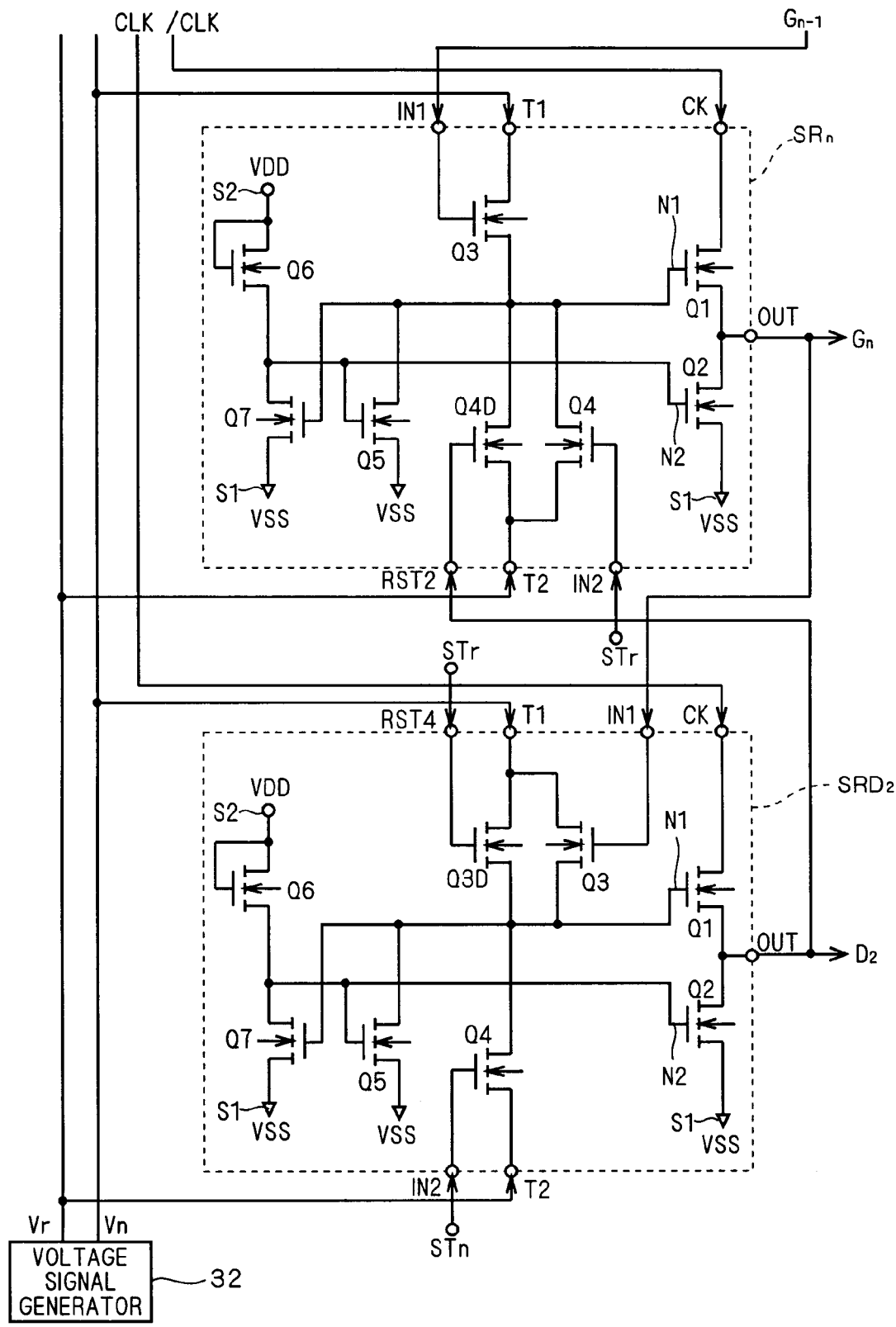
FIG. 26 is a circuit diagram showing a configuration example of the gate line driving circuit according to the ninth embodiment.

FIGS. 24 to 26 are views showing the configuration of the gate line driving circuit 30 according to the ninth embodiment. As shown in the block diagram of FIG. 24, the gate line driving circuit 30 according to the present embodiment is also configured by a bi-directional shift register comprising a plurality of stages, but a first dummy shift register $SRD_1$ acting as the first dummy stage is arranged in a further previous stage of the unit shift register $SR_1$ of the leading stage for driving the gate line $GL_1$ in the plurality of stages, and a second dummy shift register $SRD_2$ serving as the second dummy stage is arranged on the further next stage of the unit shift register $SR_n$ of the final stage for driving the gate line $GL_n$. That is, the gate line driving circuit 30 comprises a plurality of stages including the first dummy stage at the beginning and the second dummy stage at the end. Each stage of the relevant gate line driving circuit 30 may be any of the bi-directional unit shift register SR of each embodiment, or that of the prior art shown in FIG. 3 may be applied.

As shown in FIG. 24, the first control pulse STn is input to the first input terminal IN1 of the unit shift register $SR_1$ of the leading stage (excluding the first dummy shift register $SRD_1$ which is the first dummy stage), and the output signal of the previous stage is input to the first input terminal IN1 of the subsequent stages (unit shift register SR2 to second dummy shift register $SRD_2$). The second control pulse STr is input to the first input terminal IN1 of the first dummy shift register $SRD_1$.

The second control pulse STr is input to the second input terminal IN2 of the final stage (excluding the second dummy shift register $SRD_2$ which is the second dummy stage), and the output signal of the next stage is input to the second input terminal IN2 of the previous stages (unit shift register $SR_{n-1}$ to first dummy shift register $SRD_1$). The first control pulse STn is input to the second input terminal IN2 of the second dummy shift register $SRD_2$.

In the present embodiment, the unit shift register $SR_1$ of the leading stage, the unit shift register $SR_n$ of the final stage, the first dummy shift register $SRD_1$, and the second dummy shift register $SRD_2$ each includes predetermined reset terminals RST1, RST2, RST3, RST4. As in FIG. 24, the output signal $D_1$ of the first dummy shift register $SRD_1$ is input to the reset terminal RST1 of the unit shift register $SR_1$, the output signal $D_2$ of the second dummy shift register $SRD_2$ is input to the reset terminal RST2 of the unit shift register $SR_n$, the first control pulse STn is input to the reset terminal RST3 of the first dummy shift register $SRD_1$, and the second control pulse STr is input to the reset terminal RST4 of the second dummy shift register $SRD_2$. The unit shift register $SR_1$, the unit shift register $SR_n$, the first dummy shift register $SRD_1$, and the second dummy shift register $SRD_2$ are configured so as to be in the reset state (state in which the node N1 is at L level and the node N2 is at H level) when the signal is input to the respective reset terminals RST1, RST2, RST3, RST4 (to be specifically described below).

In the following description, each stage of each bi-directional shift register configuring the gate line driving circuit 30 is assumed to have the configuration of the bi-directional unit shift register SR (FIG. 7) of the first embodiment. The unit shift register $SR_1$ of the leading stage, the unit shift register $SR_n$ of the final stage, the first dummy shift register $SRD_1$, and the second dummy shift register $SRD_2$ have a configuration different from the other stages as is described above, but all have the configuration of the bi-directional unit shift register SR of the first embodiment.

FIG. 25 is a specific circuit diagram of the first dummy shift register $SRD_1$ and the unit shift register $SR_1$ in the gate line driving circuit 30 of the present embodiment, and FIG. 26 is a specific circuit diagram of the unit shift register $SR_n$ and the second dummy shift register $SRD_2$.

Focusing on the unit shift register $SR_1$ of FIG. 25, the relevant unit shift register $SR_1$ has the same configuration as in FIG. 7 besides the fact that the transistor Q3D is connected in parallel to the transistor Q3. The gate of the transistor Q3D is connected to the reset terminal RST1.

Similarly, the first dummy shift register $SRD_1$ has the same configuration as in FIG. 7 besides the fact that the transistor Q4D is connected in parallel to the transistor Q4. The gate of the transistor Q4D is connected to the reset terminal RST3.

Focusing on the unit shift register $SR_n$ of FIG. 26, the relevant unit shift register SRn has the same configuration as in FIG. 7 (i.e., same circuit configuration as first dummy shift register $SRD_1$) besides the fact that the transistor Q4D is connected in parallel to the transistor Q4. The gate of the transistor Q4D is connected to the reset terminal RST2.

Similarly, the second dummy shift register $SRD_2$ has the same configuration as in FIG. 7 (i.e., same circuit configuration as unit shift register $SR_1$) besides the fact that the transistor Q3D is connected in parallel to the transistor Q3. The gate of the transistor Q3D is connected to the reset terminal RST4.

The operation of the gate line driving circuit 30 according to the present embodiment will now be described. The operation of performing the forward shift will be described first. In the forward shift, the first voltage signal Vn supplied by the voltage signal generator 32 is set at H level, and the second voltage signal Vr is set at L level. In this case, the transistor Q4D of the first dummy shift register $SRD_1$ and the transistor Q4D of the unit shift register $SR_n$ operate to discharge the node N1. The unit shift registers $SR_1$ to $SR_n$ are assumed to be already in the reset state (state in which the node N1 is at L level, and node N2 is at H level) for the sake of simplifying the description.

FIG. 27 is a timing chart showing the operation in time of forward shift of the gate line driving circuit 30 according to the present embodiment. As shown in FIG. 27, the first control pulse STn serving as the start pulse is input to the first input terminal IN1 of the unit shift register $SR_1$ of the leading stage at a predetermined timing in the forward shift. The unit shift register $SR_1$ thereby becomes the set state (state in which the node N1 is at H level and the node N2 is at L level). The second control pulse STr is not activated and maintained at L level.

The first control pulse STn (start pulse) is input to the reset terminal RST3 of the first dummy shift register $SRD_1$ and the second input terminal IN2 of the second dummy shift register $SRD_2$. In the first dummy shift register $SRD_1$, the transistor Q4D is turned ON, the node N1 becomes L level, and the state of the first dummy shift register $SRD_1$ becomes the reset state. Therefore, the output signal $D_1$ of the first dummy shift register $SRD_1$ becomes L level, and the transistor Q3D of the unit shift register $SR_1$ is turned OFF.

In the second dummy shift register $SRD_2$, the transistor Q4 is turned ON, the node N1 becomes L level, and the state of the second dummy shift register $SRD_2$ also becomes the reset state. Therefore, the output signal $D_2$ of the second dummy shift register $SRD_2$ becomes L level and the transistor Q3D of unit shift register $SR_1$ is turned OFF.

Subsequently, the signal is sequentially transmitted to the unit shift registers $SR_1$ to $SR_n$ and the second dummy shift register $SRD_2$ as shown in FIG. 27 in synchronization with the clock signals CLK, /CLK according to the operation of forward shift similar to the first embodiment, and the output signals $G_1, G_2, G_3, \ldots, G_n, D_2$ sequentially become H level.

As apparent from FIG. 27, the output signal $D_2$ of the second dummy shift register $SRD_2$ becomes H level immediately after the unit shift register $SR_n$ of the final stage outputs the output signal $G_n$. The output signal $D_2$ is input to the reset terminal RST2 of the unit shift register $SR_n$, whereby the relevant transistor Q3D is turned ON and the relevant unit shift register SRn becomes the reset state. That is, the output signal $D_2$ functions as the end pulse of having the unit shift register $SR_n$ of the final stage in the reset state. The second dummy shift register $SRD_2$ becomes the reset state by the first control pulse STn serving as the start pulse of the next frame, and thus is similarly operable in the next frame.

Therefore, only the start pulse (first control pulse STn) is required in the operation of the forward shift of the gate line driving circuit 30 according to the present embodiment, and the end pulse is unnecessary.

The operation of performing the reverse shift will now be described. The first voltage signal Vn is at L level, and the second voltage signal Vr is H level in the reverse shift. In this case, the transistor Q3D of the unit shift register $SR_1$ and the transistor Q3D of the second dummy shift register $SRD_2$ operate to discharge the node N1. The unit shift registers $SR_1$ to $SR_n$ are also assumed to be already in the reset state (state in which the node N1 is at L level, and the node N2 is at H level).

FIG. 28 is a timing chart showing the operation in time of reverse shift of the gate line driving circuit 30 according to the present embodiment. As shown in FIG. 28, the second control pulse STr serving as the start pulse is input to the second input terminal IN2 of the unit shift register SRn of the final stage at a predetermined timing in the reverse shift. The unit shift register SRn thereby becomes the set state (state in which the node N1 is at H level, and the node N2 is at L level). The first control pulse STn is not activated and maintained at L level.

The second control pulse STr (start pulse) is input to the first input terminal IN1 of the first dummy shift register $SRD_1$ and the reset terminal RST4 of the second dummy shift register $SRD_2$. In the first dummy shift register $SRD_1$, the transistor Q3 is turned ON, and the node N1 becomes L level, and the state of the relevant first dummy shift register $SRD_1$ becomes the reset state. Therefore, the output signal $D_1$ of the first dummy shift register $SRD_1$ becomes L level, and the transistor Q3D of the unit shift register $SR_1$ is turned OFF.

In the second dummy shift register $SRD_2$, the transistor Q3D is turned ON, the node N1 becomes L level, and the state of the second dummy shift register $SRD_2$ also becomes the reset state. Therefore, the output signal $D_2$ of the second dummy shift register $SRD_2$ becomes at L level, and the transistor Q4D of the unit shift register SRn is turned OFF.

Subsequently, the signal is sequentially transmitted to the unit shift registers $SR_1$ to $SR_n$ and the first shift register $SRD_1$ as shown in FIG. 28 in synchronization with the clock signals CLK, /CLK according to the operation of reverse shift similar to the first embodiment, and the output signals $G_n, G_{n-1}, G_{n-2}, \ldots, G_1, D_1$ sequentially become H level.

As apparent from FIG. 28, the output signal D1 of the first dummy shift register $SRD_1$ becomes H level immediately after the unit shift register $SR_1$ of the leading stage outputs the output signal $G_1$. The output signal $D_1$ is input to the reset terminal RST1 of the unit shift register $SR_1$, whereby the relevant transistor Q3 is turned ON and the relevant unit shift register SR$_1$ becomes the reset state. That is, the output signal D$_1$ functions as the end pulse of having the unit shift register SR$_1$ of the leading stage in the reset state. The first dummy shift register SRD$_1$ becomes the reset state by the second control pulse STr serving as the start pulse of the next frame, and thus is similarly operable in the next frame.

Therefore, only the start pulse (second control pulse STr) is required in the operation of the reverse shift of the gate line driving circuit 30 according to the present embodiment, and the end pulse is unnecessary.

According to the present embodiment described above, the operation of the forward shift and the reverse shift can be performed with only the start pulse without using the end pulse in the bi-directional shift register. That is, the drive controlling device for controlling the operation of the gate line driving circuit 30 only needs to include the output circuit of the start pulse, and the problem of increase in cost (third problem) is resolved.

As described above, the transistor Q3D or the transistor Q4D arranged in the unit shift register SR$_1$, SR$_n$, and the first and second dummy shift registers SRD$_1$, SRD$_2$ of the bi-directional shift register of the present embodiment function to discharge the corresponding nodes N1. When discharging the node N1 of each unit shift register SR, large driving ability (ability to flow current) is ensured compared to when charging the same, and high speed is not required. Thus, the size of the transistors Q3D, Q4D may be small compared to the transistors Q3, Q4, and may be about 1/10 and the like. Since the parasitic capacity of the node N1 becomes large when the size of the transistors Q3D, Q4D is large, the action of boosting the node N1 by the clock signal CLK or /CLK becomes small. The driving ability of the transistor Q1 becomes lower, and thus it is desirably small to a certain extent.

Each stage of the bi-directional shift register has a configuration of the unit shift register SR of the first embodiment in the above description, but the bi-directional unit shift register SR applied to the present embodiment may be the bi-directional unit shift register SR of each embodiment or that of the prior art shown in FIG. 3 may be applied, as described above.

In such case as well, the transistor Q3D parallel connected to the transistor Q3 is arranged in the unit shift register SR$_1$ of the leading stage, the transistor Q4D parallel connected to the transistor Q4 is arranged in the unit shift register SR$_n$ of the final stage, the transistor Q4D parallel connected to the transistor Q4 is arranged in the first dummy shift register SRD$_1$, and the transistor Q3D parallel connected to the transistor Q3 is arranged in the second dummy shift register SRD$_2$.

However, a transistor must be added in parallel to the transistors Q3A, Q4A when connecting the transistor Q3 to the first voltage signal terminal T1 by way of the transistor Q3A and connecting the transistor Q4 to the second voltage signal terminal T2 by way of the transistor Q4A as in the fourth embodiment (FIG. 11) and the fifth embodiment (FIG. 13).

Figure 29:
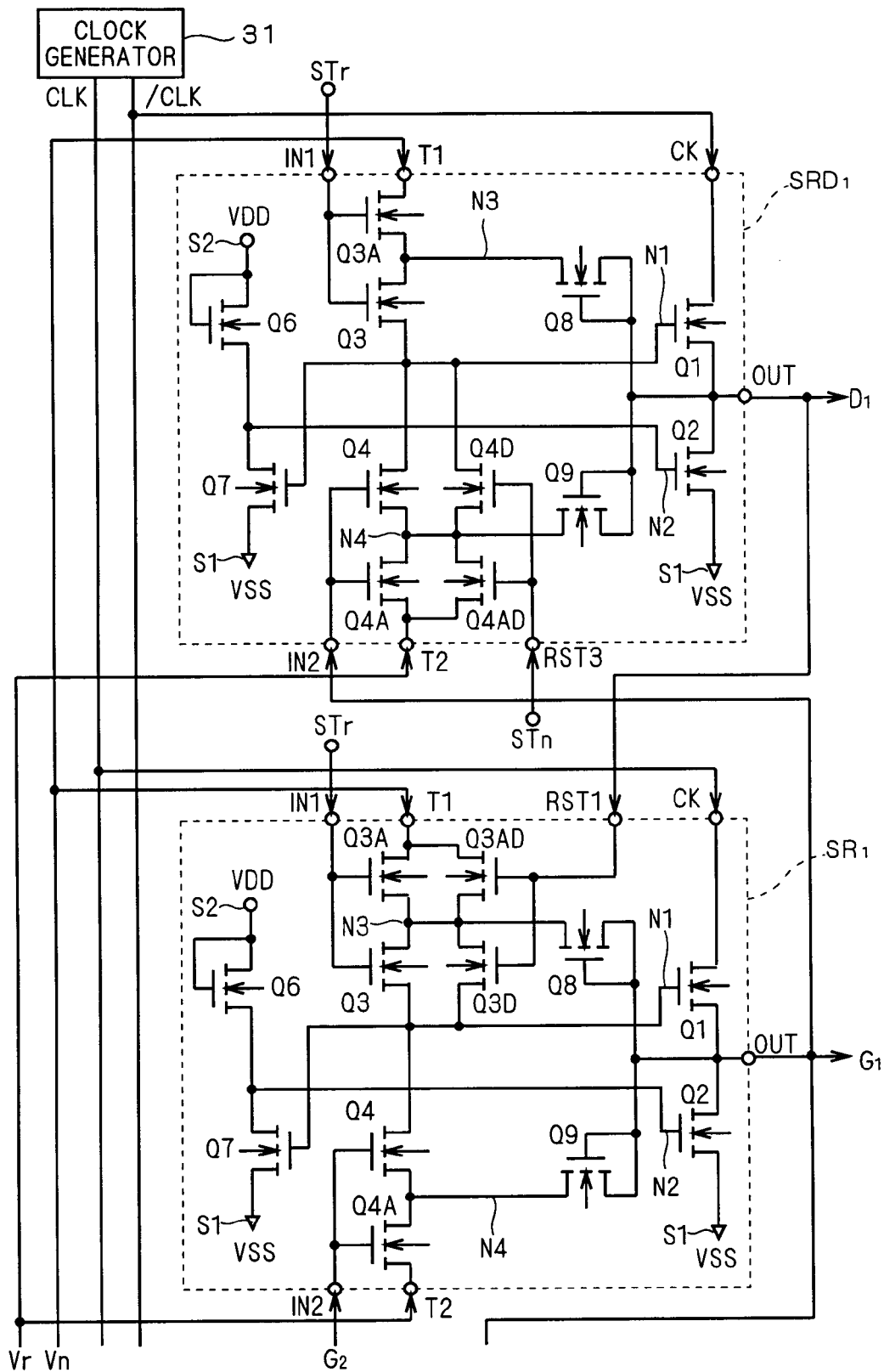
FIG. 29 is a circuit diagram showing a configuration example of the gate line driving circuit according to the ninth embodiment.
Figure 30:
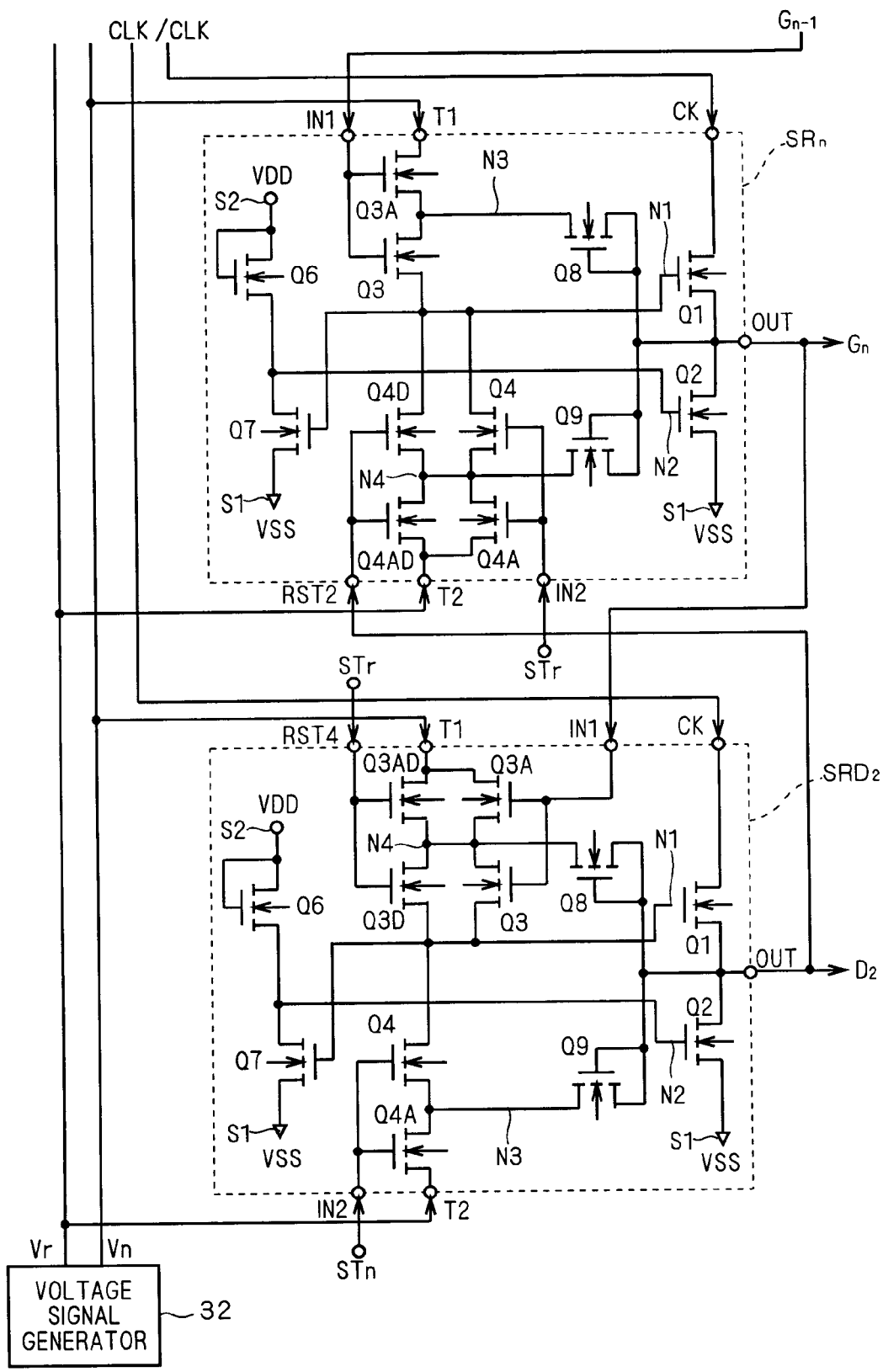
FIG. 30 is a circuit diagram showing a configuration example of the gate line driving circuit according to the ninth embodiment.

FIGS. 29 and 30 show an example in which the unit shift register SR of the fourth embodiment (FIG. 11) is applied to each stage of the gate line driving circuit 30 of the present embodiment. As shown in FIG. 29, the transistors Q3D, Q3AD are arranged in parallel to the transistors Q3, Q3A, respectively, in the unit shift register SR$_1$ of the leading stage, and the gates thereof are connected to the reset terminal RST1. The transistors Q4D, Q4AD are arranged in parallel to the transistors Q4, Q4A, respectively, in the first dummy shift register SRD$_1$, and the gates thereof are connected to the reset terminal RST3.

As shown in FIG. 30, the transistors Q4D, Q4AD are arranged in parallel to the transistors Q4, Q4A, respectively, in the unit shift register SR1 of the final stage, and the gates thereof are connected to the reset terminal RST2. The transistors Q3D, Q3AD are arranged in parallel to the transistors Q3, Q3A, respectively, in the second dummy shift register SRD$_2$, and the gates thereof are connected to the reset terminal RST4. According to such configuration, the operation of the forward shift and the reverse shift are possible only with the start pulse similar to the above.

In this case as well, the transistors Q3D, Q3AD, Q4D, Q4AD respectively function to discharge the level of the node N1, and thus the size thereof may be small compared to the transistors Q3, Q3A, Q4, Q4A, and may be about 1/10 and the like. Since the parasitic capacity of the node N1 becomes large when the size of the transistors Q3D, Q3AD, Q4D, Q4AD is large, the action of boosting the node N1 by the clock signal CLK or /CLK becomes small, thereby lowering the driving ability of the transistor Q1. Thus, it is desirable to be small to a certain extent.

While the invention has been shown and described in detail, the foregoing description is in all aspects illustrative and not restrictive. It is therefore understood that numerous modifications and variations can be devised without departing from the scope of the invention.

What is claimed is:

1. A shift register circuit comprising:

first and second input terminals, an output terminal and a clock terminal;

a first transistor for providing a clock signal input to said clock terminal to said output terminal;

a second transistor for discharging said output terminal;

first and second voltage signal terminals input with first and second voltage signals complementary to each other;

a third transistor for providing said first voltage signal to a first node connected with a control electrode of said first transistor based on a first input signal input to said first input terminal;

a fourth transistor for providing said second voltage signal to said first node based on a second input signal input to said second input terminal;

a fifth transistor for providing said second voltage signal to a second node connected with a control electrode of said second transistor based on said first input signal; and a sixth transistor for providing said first voltage signal to said second node based on said second input signal, wherein said shift register circuit changes a shift direction of a signal at the output terminal by switching the levels of said first and second voltage signals, and wherein said third transistor connects to said first voltage signal terminal by way of a seventh transistor having a control electrode connected to a control electrode of said third transistor;

said fourth transistor connects to said second voltage signal terminal by way of an eighth transistor having a control electrode connected to a control electrode of said fourth transistor; and said shift register circuit further includes a charging circuit for charging a third node, which is a connecting node of said third transistor and said seventh transistor, and a fourth node, which is a connecting node of said fourth transistor and said eighth transistor, when said output terminal is activated.

2. The shift register circuit according to claim 1, wherein said charging circuit includes,
a unidirectional first switching element connected between said output terminal and said third node having the direction from said output terminal to said third node as forward direction; and
a unidirectional second switching element connected between said output terminal and said fourth node having the direction from said output terminal to said fourth node as forward direction.

3. The shift register circuit according to claim 1, further comprising:
a ninth transistor for discharging said fourth node based on said first input signal; and
a tenth transistor for discharging said third node based on said second input signal.

4. A shift register circuit comprising a plurality of stages, wherein each stage is the shift register circuit according to claim 1;
a predetermined first control pulse is input to said first input terminal of leading stage and an output signal of the previous stage is input to said first input terminal of the subsequent stage; and
a predetermined second control pulse is input to said second input terminal of the final stage and an output signal of the next stage is input to said second input terminal of the previous stage.

5. A shift register circuit comprising a plurality of stages including a first dummy stage at the beginning and a second dummy stage at the end; wherein
each stage is the shift register circuit according to claim 1;
a predetermined first control pulse is input to said first input terminal of leading stage excluding said first dummy stage and an output signal of the previous stage is input to said first input terminal of the subsequent stage; and
a predetermined second control pulse is input to said second input terminal of the final stage excluding said second dummy stage and an output signal of the next stage is input to said second input terminal of the previous stage;
said leading stage further includes an eleventh transistor for discharging said first node of said leading stage based on an output signal of said first dummy stage; and
said final stage further includes a twelfth transistor for discharging said first node of said final stage based on an output signal of said second dummy stage.

6. The shift register circuit according to claim 5, wherein
said first dummy stage has said second control pulse input to said first input terminal, and further includes a thirteenth transistor for discharging said first node of said first dummy stage based on said first control pulse; and
said second dummy stage has said first control pulse input to said second input terminal, and further includes a fourteenth transistor for discharging said first node of said second dummy stage based on said second control pulse.

7. An image display apparatus including a shift register circuit of a plurality of stages as a gate line driving circuit; wherein
each stage includes,
first and second input terminals, an output terminal and a clock terminal;
a first transistor for providing a clock signal input to said clock terminal to said output terminal;
a second transistor for discharging said output terminal;
first and second voltage signal terminals input with first and second voltage signals complementary to each other;
a third transistor for providing said first voltage signal to a first node connected with a control electrode of said first transistor based on a first input signal input to said first input terminal;
a fourth transistor for providing said second voltage signal to said first node based on a second input signal input to said second input terminal;
a fifth transistor for providing said second voltage signal to a second node connected with a control electrode of said second transistor based on said first input signal; and
a sixth transistor for providing said first voltage signal to said second node based on said second input signal;
a predetermined first control pulse is input to said first input terminal of leading stage and an output signal of the previous stage is input to said first input terminal of the subsequent stage; and
a predetermined second control pulse is input to said second input terminal of the final stage and an output signal of the next stage is input to said second input terminal of the previous stage, wherein
said shift register circuit changes a shift direction of a signal at the output terminal by switching the levels of said first and second voltage signals, and wherein
said third transistor connects to said first voltage signal terminal by way of a seventh transistor having a control electrode connected to a control electrode of said third transistor;
said fourth transistor connects to said second voltage signal terminal by way of an eighth transistor having a control electrode connected to a control electrode of said fourth transistor; and
said shift register circuit further includes a charging circuit for charging a third node, which is a connecting node of said third transistor and said seventh transistor, and a fourth node, which is a connecting node of said fourth transistor and said eighth transistor, when said output terminal is activated.

* * * * *